United States Patent

Hayashi et al.

[11] Patent Number: 6,075,829
[45] Date of Patent: Jun. 13, 2000

[54] DIGITAL BROADCAST RECEIVER

[75] Inventors: Yoshikazu Hayashi, Ibaraki; Noriaki Omoto, Takatsuki; Takaaki Konishi; Hiroshi Azakami, both of Ibaraki; Takashi Hasegawa, Takatsuki, all of Japan

[73] Assignee: Matsushita Electric Industrial Co., Ltd., Osaka, Japan

[21] Appl. No.: 08/865,829

[22] Filed: May 30, 1997

[30] Foreign Application Priority Data

May 30, 1996 [JP] Japan .................................. 8-136224
Aug. 5, 1996 [JP] Japan .................................. 8-205634

[51] Int. Cl.[7] .................................................. H04L 27/06
[52] U.S. Cl. ........................ 375/344; 375/325; 375/326; 375/327; 375/329; 329/304; 455/260
[58] Field of Search ..................................... 375/325, 326, 375/327, 329, 340, 344, 362, 371, 376, 261, 279, 284, 285, 324, 346, 348, 342, 332, 281; 329/304, 307; 455/182.2, 183.2, 131, 260, 209, 265, 316

[56] References Cited

U.S. PATENT DOCUMENTS

| | | |
|---|---|---|
| 4,198,604 | 4/1980 | Holdaway . |
| 4,551,689 | 11/1985 | Scala et al. . |
| 4,811,424 | 3/1989 | Cox . |
| 5,038,404 | 8/1991 | Marz . |
| 5,307,071 | 4/1994 | Arnold et al. ........................ 342/103 |
| 5,325,401 | 6/1994 | Halik et al. ................ 375/83 |
| 5,414,741 | 5/1995 | Johnson ................ 375/376 |
| 5,438,591 | 8/1995 | Oie et al. ................ 375/261 |
| 5,483,686 | 1/1996 | Saka et al. ........................ 455/182.2 |
| 5,487,186 | 1/1996 | Scarpa ................ 455/192.2 |
| 5,528,633 | 6/1996 | Halik et al. ................ 375/326 |
| 5,640,125 | 6/1997 | Alard ................ 329/306 |
| 5,729,570 | 3/1998 | Magill ................ 375/206 |
| 5,754,258 | 5/1998 | Hanaya et al. ................ 348/734 |

*Primary Examiner*—Chi H. Pham
*Assistant Examiner*—Jean B Corrielus
*Attorney, Agent, or Firm*—Ratner & Prestia

[57] ABSTRACT

A digital broadcast receiver for receiving a digital modulation signal of the present invention includes channel selection means inputting a digital modulation signal of a radio frequency band and frequency converting a desired digital modulation signal into a designated intermediate frequency signal; oscillation means for generating a local oscillation signal used for frequency conversion at the channel selection means; oscillation frequency control means for controlling a frequency of the local oscillation signal at the oscillation means; phase noise characteristic control means for improving a phase noise characteristic of the local oscillation signal generated at the oscillation means; filter means for extracting the intermediate frequency signal selected at channel selection means; orthogonal detection means for orthogonally detecting the intermediate frequency signal extracted at the filter means; A/D converter means for converting the analog output of the orthogonal detection means into a digital signal; and digital demodulation means for digitally demodulating the output of the A/D converter means; and makes a high performance digital reception possible which can improve an AFC function by the channel selection means and can improve a bit error rate at the same time.

9 Claims, 16 Drawing Sheets

DIGITAL BROADCAST RECEIVER

BACKGROUND OF THE INVENTION

The present invention relates to a digital broadcast receiver for receiving a digital broadcast signal transmitted as a digitally modulated video signal.

A usual satellite broadcast receiver is a receiver for receiving an FM (frequency modulated) satellite broadcast signal transmitted with a frequency modulated video signal and as shown in FIG. 13, a desired frequency modulated signal is frequency converted from a first IF (intermediate frequency) signal from a digitally modulated signal into a designated second intermediate frequency signal, a frequency modulated signal in the desired channel is taken out at a channel filter and then it is frequency demodulated.

A local oscillation signal used for the frequency conversion is generated at a PLL (phase-locked loop) synthesizer 30, which is composed of a local oscillator 31, a prescaler 32 frequency dividing a local oscillation signal, a programmable frequency divider 33, a phase frequency detector 34, a reference frequency signal divider 35, a reference frequency signal generator 36 and a loop filter 37. The local oscillation frequency Fvco is expressed by (eq. 1).

$$fvco=(fr/R) \times Npsc \times Np \qquad (eq. 1)$$

where fvco: oscillation frequency of the local oscillator, fr: frequency of the reference frequency signal, Npsc: frequency dividing ratio of the prescaler, Np: frequency dividing ratio of the programmable frequency divider, and R: frequency dividing ratio of the reference frequency signal.

The local oscillation signal according to the frequency of the desired channel is obtained by varying the dividing ratio of programmable frequency divider 33 by microcomputer (CPU) 50. AFC (automatic frequency control) for compensating the frequency drift of the first IF signal due to the frequency drift of a frequency converter (not shown in the drawing) in a receiving antenna for satellite broadcast is made by that microcomputer 50 controls the frequency dividing ratio of programmable frequency divider 33 in PLL synthesizer 30 by a frequency drift detecting signal outputted from a FM demodulator 201, as disclosed in U.S. Pat. No. 1,871,000.

A usual receiver for digital broadcast receiving a transmitted signal using QPSK (quaternary phase-shift keying) modulation as a digital modulation shown in FIG. 14 is a receiver for FM satellite broadcast frequency-modulating a video signal and a QPSK-modulated PCM (pulse code modulation) audio signal and a desired FM signal is obtained by frequency-converting into a designated second IF signal from the first IF signal outputted from the antenna for satellite broadcast and an FM signal of the desired channel is taken out through a channel filter and is frequency modulated and then it is separated into a video signal and an audio signal and they are processed.

A local oscillation signal used for the frequency conversion is generated at a PLL synthesizer 30, which is composed of a local oscillator 31, a prescaler 32 frequency dividing a local oscillation signal, a programmable frequency divider 33, a reference frequency signal generator 36, a reference frequency signal divider 35, phase detection means 34 and a loop filter 37. The local oscillation frequency can be expressed by (eq. 1) like the case of broadcast receiver receiving a previously-mentioned FM signal.

Therefore, a local oscillation signal corresponding to a desired channel frequency is obtained by varying a frequency dividing ratio of the programmable frequency divider by microcomputer 50.

The control by microcomputer 50 is necessary for a control of many LSIs (large scale integrations) such as not only PLL synthesizer 30 but also PCM sound signal processor 205 and the like. A common bus such as an IIC (inter integrated circuit) bus is used as a control bus because the number of output terminals of microcomputer 50 has a limitation.

AFC for compensating the frequency drift of the first IF signal due to the frequency drift of a frequency converter in a receiving antenna for satellite broadcast is made by that microcomputer 50 controls the frequency dividing ratio of programmable frequency divider 33 in PLL synthesizer 30 by a frequency drift detecting signal outputted from a FM demodulator 201, as disclosed in U.S. Pat. No. 1,871,000, like an example of the prior art. The control data of the microcomputer is renewed at every several tens milliseconds, considering malfunction of a PLL synthesizer and each LSI (large scale integration circuit) due to a surge of thunder even after signal reception.

However, in the case in which a usual AFC is done at a PLL synthesizer for channel selection, the reference frequency fr/R of a phase detection at the PLL synthesizer determines AFC accuracy and if the frequency dividing ratio of the reference frequency signal is so much decreased, the number of steps of AFC control becomes large and a correct AFC can not be done. In a receiver of digital modulation such as QPSK modulation, because the phase noise characteristic of a local oscillation frequency signal influences a bit error rate, the phase noise must be small and it is necessary not only to improve a phase noise characteristic of a local oscillator circuit itself but also to improve a phase noise characteristic by the PLL synthesizer such as making a reference frequency fr/R of the PLL synthesizer for phase frequency detection large.

In the case of a receiver receiving a digitally modulated signal such as QPSK modulation, when a control data is inputted from a microcomputer to a PLL synthesizer, the control data gives an interference to the local oscillator circuit for channel selection and the noise characteristic of the local oscillation signal rapidly deteriorates. Thus, the noise characteristic of the local oscillation signal gives an influence to the bit error rate.

By using a control bus from the microcomputer to the PLL synthesizer in common with a control bus of the other signal processing LSIs, when the other signal processing LSIs are controlled during reception, the control data is inputted also to the PLL synthesizer and whenever AFC during reception is made in the PLL synthesizer or the control data is periodically renewed against malfunction of the PLL synthesizer due to a surge or the like, noise in the local oscillation signal becomes big and deteriorates the bit error rate and the quality of reception. This is a problem.

SUMMARY OF THE INVENTION

The present invention aims to make a high performance reception possible which can simultaneously attain improvement of AFC function at channel selection means and improvement of bit error rate possible in a receiver receiving a digitally modulated signal. To achieve this object, a digital broadcast receiver receiving a digitally modulated signal of the present invention includes:

channel selection means inputting said digitally modulated signal of an RF band and for frequency-converting a desired digitally modulated signal into an IF signal;

oscillation means for generating a local oscillation signal used for a frequency conversion at the channel selection means;

oscillation frequency control means for controlling a frequency of a local oscillation signal of the oscillation means;

phase noise characteristic control means for improving the phase noise characteristic of the local oscillation signal generated at the oscillation means;

filter means for extracting the IF signal corresponding to the selected channel;

orthogonal detection means for orthogonally detecting the IF signal extracted at the filter means;

AID conversion means for converting an analog output of the orthogonal detection means into a digital signal; and digital demodulation means for demodulating the digital output of the AID conversion means; and wherein the phase noise characteristic of the local oscillation signal is improved.

The present invention is a digital broadcast receiver in which a phase noise characteristic of a local oscillation signal is improved, keeping an AFC accuracy by that the phase noise characteristic control means does AFC (automatic frequency control) continuously at the orthogonal detection means using an AFC signal expressing a frequency drift of a receiving signal detected at the digital demodulation means and the reference frequency of phase detection of the PLL synthesizer comprising the oscillation means and the oscillation frequency control means is made as high as the phase noise near the oscillation frequency of a local oscillation signal can be reduced by making an open loop gain of the PLL synthesizer large.

The present invention is a digital broadcast receiver in which the phase noise characteristic control means prevents deterioration of a noise characteristic of a local oscillation signal by using an exclusive control bus for transmitting a control signal of oscillation frequency control means and separating it from the other control buses for transmitting control signals of the other devices including digital demodulation means.

The present invention is a digital broadcast receiver in which the phase noise characteristic of the local oscillation signal can be prevented to deteriorate and the bit error rate characteristic can be prevented to deteriorate with the control data supplied from the microcomputer during reception by limiting the control of the oscillation frequency control means to the case in which a channel is selected or the demodulation signal is not synchronized.

DESCRIPTION OF THE PREFERRED EMBODIMENTS

Some exemplary embodiments of the present invention are explained below, referring to FIGS. 1 to 11.

(First exemplary embodiment)

Figure 1:
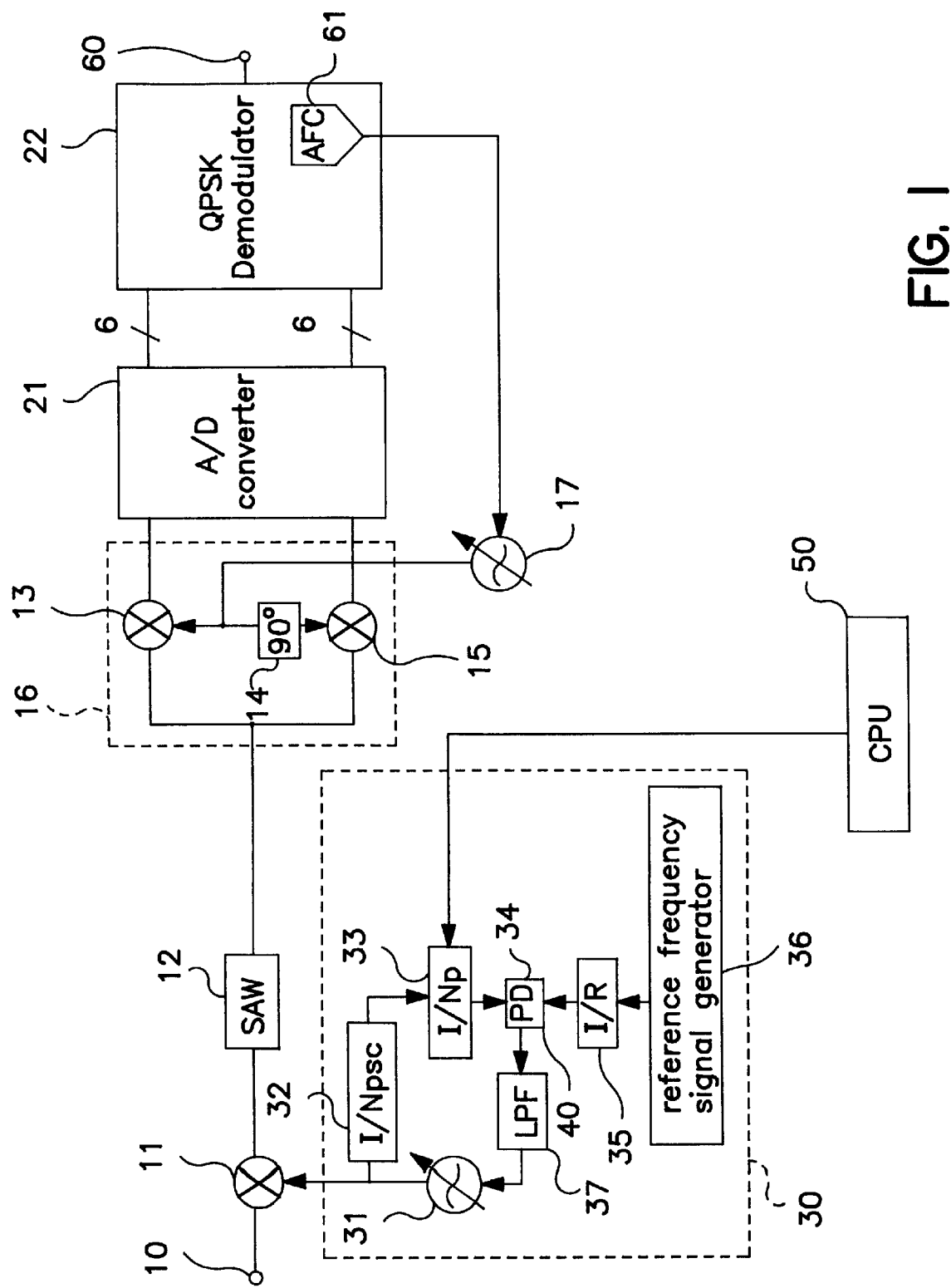
FIG. 1 is a block diagram of a digital satellite broadcast receiver in accordance with a first exemplary embodiment of the present invention.

In FIG. 1, the terminal 10 is an input terminal of a first IF signal from a receiving antenna for satellite broadcast. Mixer 11 may be used for frequency-converting a desired QPSK modulation signal into a designated second IF signal. Bandpass filter 12 may be used for extracting only the designated second IF signal from the output of mixer 1 1. Orthogonal detector 16 may be used for inputting the output of bandpass filter 12 and for obtaining base band signals of an in-phase component I and a quadrature component Q by orthogonal detection. A/D converter 21 may be used for inputting the output of the I/Q orthogonal detector 16 and for converting the I and Q base band signals into digital signals. QPSK demodulator 22 may be used for inputting the digitalized I and Q signals and for demodulating the inputted I and Q signals by QPSK. PLL synthesizer 30 may be used for generation a local oscillation signal necessary when the desired QPSK modulation signal is frequency-converted into a designated second IF signal at mixer 11. Orthogonal detection voltage-controlled oscillator 17 may be used for generating a local oscillation signal necessary for orthogonal detection.

The function of a digital broadcast receiver composed like the above is explained below. The first IF signal from a digitally modulated signal of RF band received from a receiving antenna for satellite broadcast is mixed with a local oscillation signal generated at PLL synthesizer 30 at mixer 11 and a desired QPSK modulation signal of the first IF signal is frequency-converted into a designated second IF signal.

PLL synthesizer 30 is composed of a local oscillator 31, a prescaler 32, a programmable frequency divider 33, a phase frequency detector 34, a reference frequency signal divider 35, a reference frequency signal generator 36 and a loop filter 37.

The output of local oscillator 31 is frequency-divided at prescaler 32, is inputted to programmable frequency divider 33 and is further frequency-divided. The output of programmable frequency divider 33 is inputted to phase detector 34 and PLL synthesizer 30 is controlled so that the inputted signal to phase detector 34 coincides with a reference frequency signal 40 obtained by dividing the output of a reference frequency signal generator 36 at a reference frequency signal divider 35 in frequency and phase. The local oscillation frequency fvco is expressed by eq. 2.

$$fvco=(fr/R) \times Npsc \times Np \qquad (eq. 2)$$

where fvco: oscillation frequency of the local oscillator, fr: frequency of the reference frequency signal, Npsc: frequency dividing ratio of the prescaler, Np: frequency dividing ratio of the programmable frequency divider, and R: frequency dividing ratio of the reference frequency signal.

A local oscillation frequency corresponding to a frequency of a desired QPSK modulation signal can be obtained by varying the frequency dividing ratio Np of programmable frequency divider 33 at microcomputer 50.

The QPSK modulation signal frequency-converted into a designated second IF signal at mixer 11 is inputted to orthogonal detector 16 after being extracted at bandpass filter 12. At orthogonal detector 16, an oscillation signal generated at orthogonal detection voltage-controlled oscillator 17 with a designated second IF and a signal phase-shifted by 90 degrees from the oscillation signal are supplied to mixers 13 and 15, respectively and they are mixed with the output signal of bandpass filter 12 there are base band signals of an in-phase component I and a quadrature component Q in the QPSK modulation signal are obtained, respectively. The I and Q base band signals are converted to digital signals at an A/D converter 21 and are digitally demodulated at QPSK demodulator 22. QPSK demodulator 22 includes a carrier recovery and a clock recovery necessary for demodulation, an AGC detector and an AFC detector 61.

The oscillation frequency of local oscillator 31 generating a local frequency signal used for channel selection of a QPSK modulation signal is expressed by (eq. 3).

$$fvco=f1stIF+f2ndIF \qquad (eq. 3)$$

where fvco: oscillation frequency of the local oscillator for channel selection, f1stIF: frequency of the first IF, and f2ndIF: frequency of the second IF.

The oscillation frequency of local oscillator 31 is higher than the frequency of the first IF inputted from the receiving antenna for satellite broadcast by the frequency of the second IF and a frequency range of the first IF signal is necessary as an oscillation frequency range.

Figure 4:
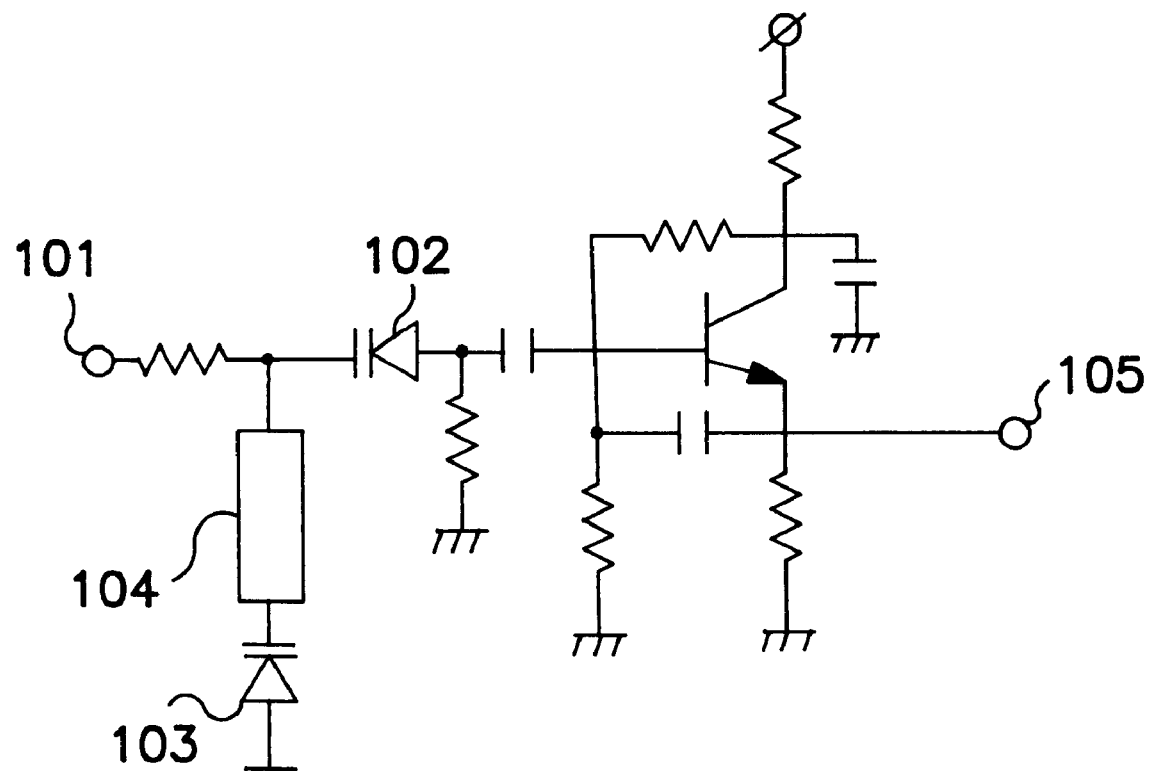
FIG. 4 is a circuit diagram of a voltage controlled oscillator composing a PLL synthesizer for channel selection.

As an oscillator circuit to obtain such a wide frequency range, an oscillator having a resonant circuit using a microstrip line and a variable capacitance diode as shown in FIG. 4 is necessary.

In a digital modulation like QPSK, the phase noise of a local oscillation signal used for frequency conversion influences on a reception performance (bit error rate) of the receiver, different from a usual FM modulation. As a phase noise not to influence on bit error rate, 85 dBc/Hz at a frequency off-set by 10 kHz from the oscillation frequency and 95 dBc/Hz at a frequency off-set by 100 kHz from the oscillation frequency.

Figure 5:
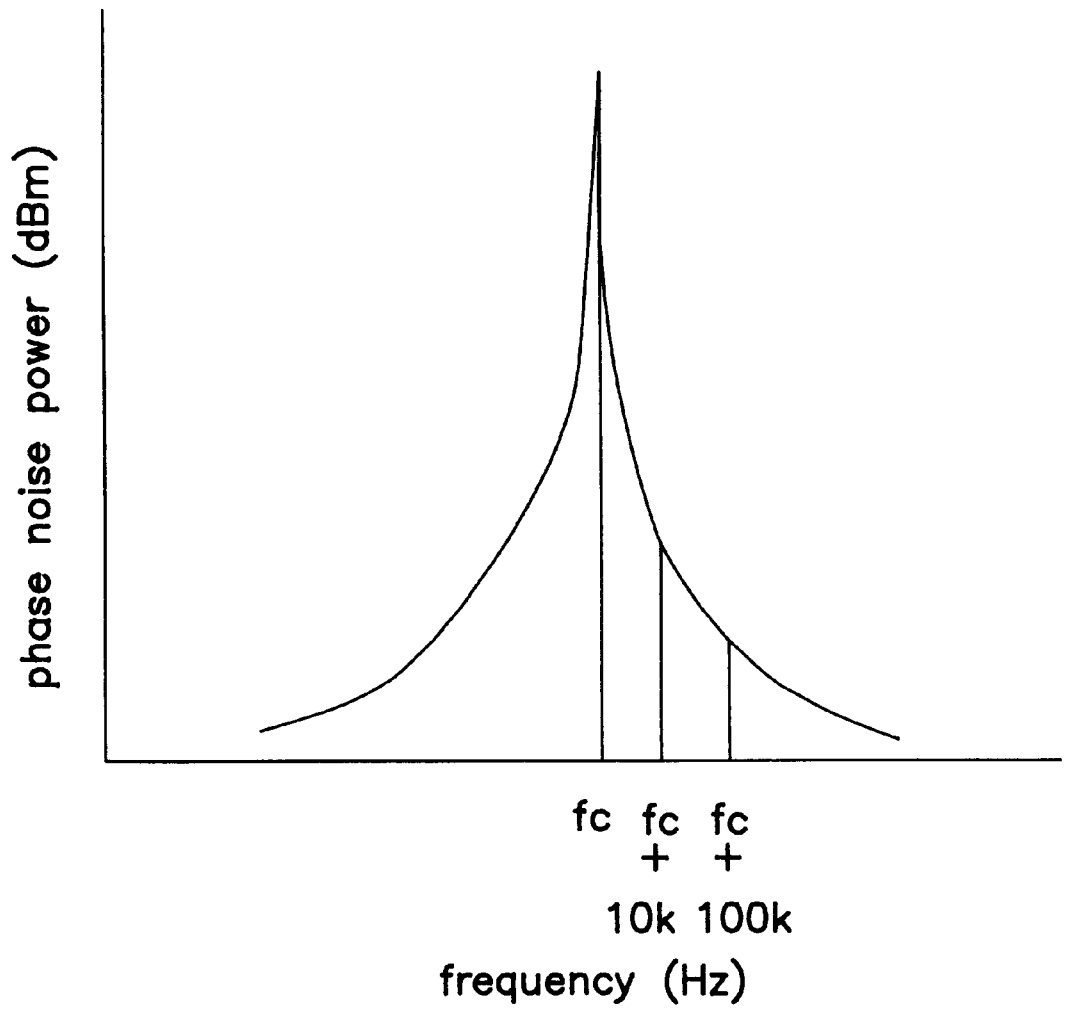
FIG. 5 is a phase noise characteristic of a voltage controlled oscillator composing a PLL synthesizer for channel selection.

The phase noise of a local oscillation signal having a wide oscillation frequency range, however, becomes large because the quality factor Q of the resonant circuit decreases due to an internal resistance of the variable capacitance diode and the phase noise power decreases according to increase of frequency deviation from the oscillation frequency as shown in FIG. 5. That is a 1/f characteristic. The noise characteristic near the oscillation frequency such as at 10 kHz and 100 kHz previously described can be improved by using a PLL synthesizer and can be realized by making a reference frequency of the phase detection at PLL synthesizer 30 high and making an open loop gain high. The reference frequency is determined by an oscillation frequency at reference frequency signal generator 36 and a frequency dividing ratio at reference frequency signal divider 35 and it is selected as high as the phase noise near the oscillation frequency can be reduced and its value is several hundreds kHz. The reference frequency (fr/R) of the phase frequency detection is a step frequency of PLL synthesizer 30 and the output frequency of local oscillator 31 is integer times of the reference frequency and does not always coincide with local oscillation frequency to convert the first IF signal into a designated second IF signal.

Figure 6:
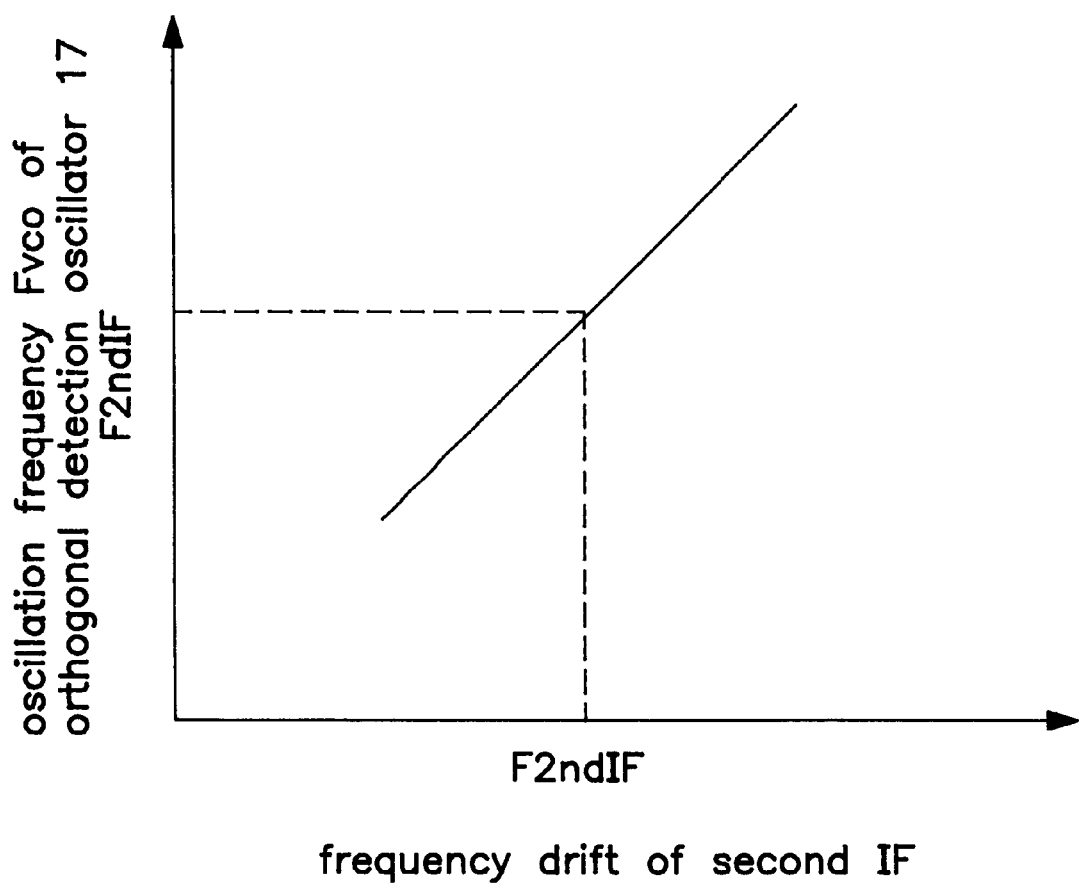
FIG. 6 is an AFC characteristic of an orthogonal detection voltage controlled oscillator.

That is, a deviation occurs in the frequency of the second IF signal. Therefore, by making orthogonal detection voltage-controlled oscillator 17 so that the oscillation frequency continuously varies by an AFC signal outputted from QPSK demodulator 22 as shown in FIG. 6, frequency drift of a frequency converter (not shown) in a receiving antenna for satellite broadcast and frequency drift from the original second IF frequency due to frequency drift by increasing the reference frequency of phase frequency detection at PLL synthesizer 30 can be compensated with high accuracy at orthogonal detector 16.

Thus, according to the first exemplary embodiment of the present invention, the characteristic of bit error rate as a receiver can be kept good, because a phase noise characteristic of the local oscillation frequency is improved keeping AFC accuracy.

The frequency drift of the second IF signal can be also compensated with a high accuracy at orthogonal detector 16 by controlling orthogonal detection voltage controlled oscillator 17 by PLL synthesizer, making its step frequency smaller enough than the step frequency of PLL synthesizer 30 used for channel selection and varying the oscillation frequency according to an AFC signal outputted from QPSK demodulator 22. Thus, the characteristic of bit error rate as a receiver can be kept good, because a phase noise characteristic of the local oscillation frequency is improved keeping AFC accuracy.

Although a reception of satellite broadcast is described in the exemplary embodiment, it is obvious to have the same effect as described above in general kinds of receivers receiving a digitally modulated signal.

(Second exemplary embodiment)

Figure 2:
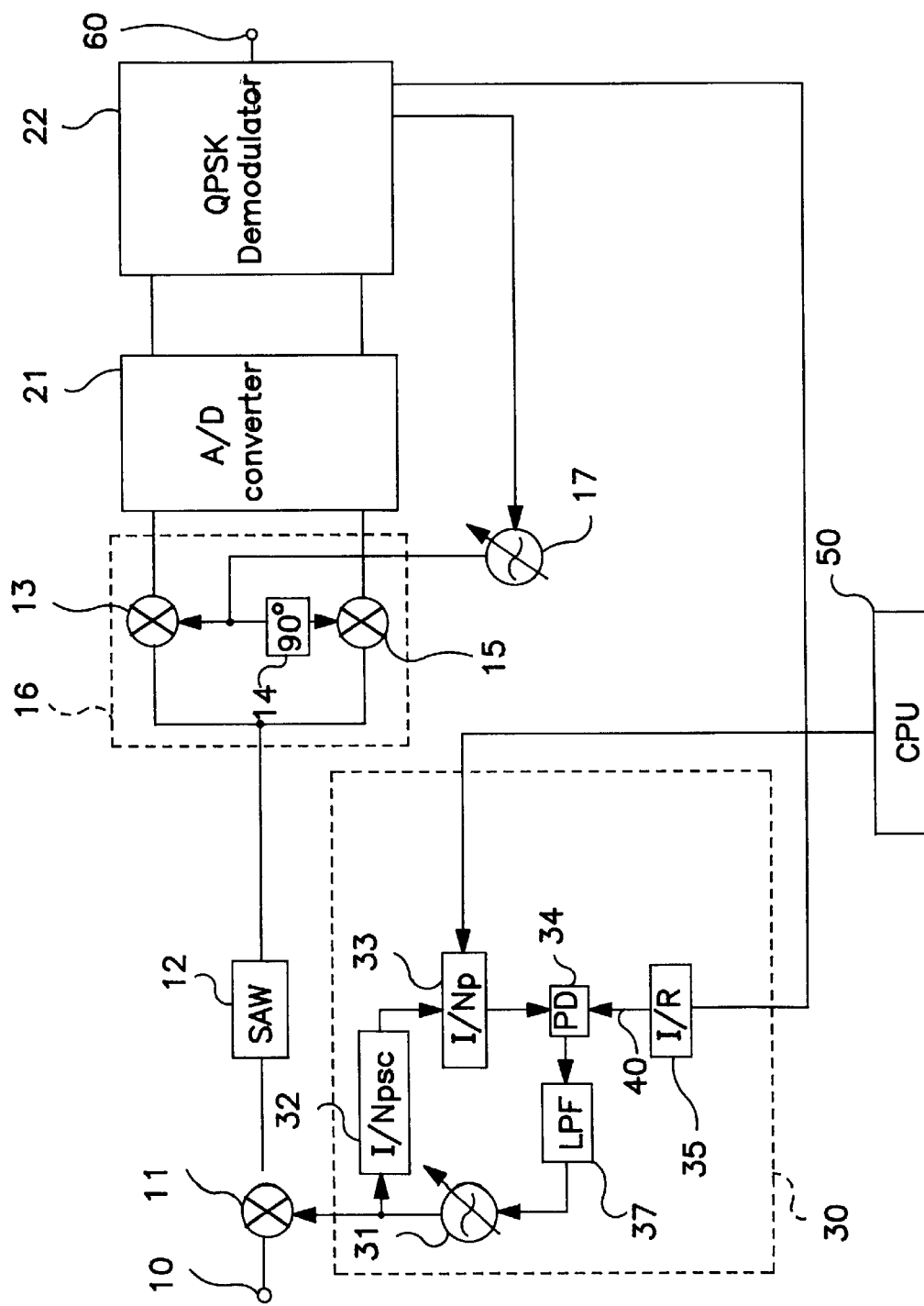
FIG. 2 is a block diagram of a digital satellite broadcast receiver in accordance with a second exemplary embodiment of the preset invention.

In FIG. 2, the terminal 10 is an input terminal of a first IF signal from a receiving antenna for satellite broadcast. Mixer 11 may be used for frequency converting a desired QPSK modulation signal into a designated second IF signal. Bandpass filter 12 may be used for extracting only the designated second IF signal from the output of mixer 11. Orthogonal detection means 16 may be used for inputting the output of bandpass filter 12 and for obtaining base band signals of an in-phase component I and a quadrature component Q by orthogonal detection. A/D converter 21 may be used for inputting the output of the I/Q orthogonal detection means 16 and for converting the base band signals of I and Q components into digital signals. QPSK demodulator 22 may be used for inputting the digitalized I and Q signals and for demodulating the inputted I and Q signals by QPSK. PLL synthesizer 30 may be used for generation a local oscillation signal necessary when the desired QPSK modulation signal is frequency-converted into a designated second IF signal at mixer 11. Orthogonal detection voltage-controlled oscillator 17 may be used for generating a local oscillation signal necessary for orthogonal detection.

The function of a digital broadcast receiver composed like the above is explained below. The first IF signal received through a receiving antenna for satellite broadcast is mixed with a local oscillation signal generated at PLL synthesizer 30 at mixer 11 and a desired QPSK modulation signal of the first IF signal is frequency-converted into a designated second IF signal.

PLL synthesizer 30 is composed of a local oscillator 31, a prescaler 32, a programmable frequency divider 33, a phase frequency detector 34, a reference frequency signal divider 35 and a loop filter 37.

The output of local oscillator 31 is frequency-divided at prescaler 32, is inputted to programmable frequency divider 33 and is further frequency-divided. The output of programmable frequency divider 33 is inputted to phase detector 34 and PLL synthesizer 30 is controlled so that the inputted signal to phase detector 34 coincides with a reference frequency signal 40 obtained by dividing the symbol clock of QPSK recovered at QPSK demodulator 22 at a reference frequency signal divider 35 in frequency and phase. The local oscillation frequency fvco is expressed by (eq. 4).

$$fvco = (fr/R) \times Npsc \times Np \qquad \text{(eq. 4)}$$

where fvco: oscillation frequency of the local oscillator, fr: frequency of the reference frequency signal, Npsc: frequency dividing ratio of the prescaler, Np: frequency dividing ratio of the programmable frequency divider, and R: frequency dividing ratio of the reference frequency signal.

A local oscillation frequency corresponding to a frequency of a desired QPSK modulation signal can be obtained by varying frequency dividing ratio Np of programmable frequency divider 33 by microcomputer 50.

The QPSK modulation signal frequency-converted into a designated second IF signal at mixer 11 is inputted to orthogonal detector 16 after being extracted at bandpass filter 12. At orthogonal detector 16, an oscillation signal generated at orthogonal detection voltage-controlled oscillator 17 with a designated second IF and a signal phase-shifted by 90 degrees from the oscillation signal are supplied to mixers 13 and 15, respectively and they are mixed with the output signal of bandpass filter 12 there and base band signals of an in-phase component I and a quadrature component Q of the QPSK modulation signal, respectively.

The I and Q base band signals are converted to digital signals at an A/D converter 21 and are digitally demodulated at QPSK demodulator 22. QPSK demodulator 22 includes a carrier recovery and a clock recovery necessary for demodulation, an AGC detector and an AFC detector.

The oscillation frequency of local oscillator 31 generating a local frequency signal used for channel selection of a QPSK modulation signal is expressed by (eq. 5).

$$fvco = f1stIF + f2ndIF \qquad \text{(eq. 5)}$$

where fvco: oscillation frequency of the local oscillator for channel selection, f1stIF: frequency of the first IF, and f2ndIF: frequency of the second IF.

The oscillation frequency of local oscillator 31 is higher than the frequency of the first IF inputted from the receiving antenna for satellite broadcast by the frequency of the second IF and a frequency range of the first IF signal is necessary as an oscillation frequency range. As an oscillator circuit to obtain such a wide frequency range, an oscillator having a resonant circuit using a microstrip line and a variable capacitance diode as shown in FIG. 4 is necessary.

In a digital modulation like QPSK, the phase noise of a local oscillation signal used for frequency conversion influences on a reception performance (bit error rate) of the receiver, different from a usual FM modulation. As a phase noise not to influence on bit error rate, 85 dBc/Hz at a frequency off-set by 10 kHz from the oscillation frequency and 95 dBc/Hz at a frequency off-set by 100 kHz from the oscillation frequency.

The phase noise of a local oscillation signal having a wide oscillation frequency range, however, becomes large because the quality factor Q of the resonant circuit decreases due to an internal resistance of the variable capacitance diode and the phase noise power decreases according to increase of frequency deviation from the oscillation frequency as shown in FIG. 5. That is a 1/f characteristic. The noise characteristic near the oscillation frequency such as 10 kHz and 100 kHz previously described can be improved by using a PLL synthesizer and can be realized by making a reference frequency of the phase detection at PLL synthesizer 30 high and making an open loop gain high. The reference frequency is determined by a frequency fr of a QPSK symbol clock (baud rate of QPSK) recovered at QPSK demodulator 22 and a frequency dividing ratio R at reference frequency signal divider 35 and it is selected as high as the phase noise near the oscillation frequency of local oscillator 31 can be reduced and its value is several hundreds kHz.

In Japan, the symbol clock frequency is 21.096 MHz in a digital satellite broadcast and to exceed the reference frequency of several hundreds kHz, a frequency dividing ratio of 32 to 128 is necessary as a frequency dividing ratio of reference frequency signal divider 35. The reference frequency fr/R of the phase frequency detection is a step frequency of PLL synthesizer 30 and the output frequency of local oscillator 31 is integer times of the reference frequency and does not always coincide with local oscillation frequency to convert the first IF signal into a designated second IF signal. That is, a deviation occurs in the frequency of the second IF signal.

Therefore, by making orthogonal detection voltage-controlled oscillator 17 so that the oscillation frequency continuously varies by an AFC signal outputted from QPSK demodulator 22 as shown in FIG. 6, frequency drift of a frequency converter (not shown) in a receiving antenna for satellite broadcast and frequency drift from the original second IF frequency due to frequency drift by increasing the reference frequency of PLL synthesizer 30 can be compensated with high accuracy at orthogonal detector 16.

Thus, according to the second exemplary embodiment of the present invention, because a phase noise characteristic of the local oscillation frequency is improved keeping AFC accuracy, the characteristic of bit error rate as a receiver can be kept good and because a clock signal recovered at QPSK demodulator 22 is frequency-divided and the divided signal is used as a reference frequency signal of phase frequency detection at PLL synthesizer 30 and a clock signal of the transmitter side in good accuracy is used as reference frequency signal, the frequency accuracy of the reference frequency signal against temperature variation is kept good and a reference frequency signal generator in PLL synthesizer 30 can be eliminated.

It is obvious that a similar effect can be obtained also in the case in which the reference frequency signal of the phase frequency detection at PLL synthesizer 30 is obtained by frequency-dividing a sampling clock of the A/D converter 21 recovered at QPSK demodulator 22 and a reference frequency signal divider 35 having a frequency dividing ratio corresponding to that of the sampling clock.

Also by controlling orthogonal detection voltage-controlled oscillator 17 by PLL synthesizer, making the step frequency smaller enough than the step frequency of PLL synthesizer 30 used for channel selection and varying the oscillation frequency according to the AFC signal outputted from QPSK demodulator 22, frequency drift of the second IF signal can be compensated with high accuracy at orthogonal detector 16 and the characteristic of bit error rate as a receiver can be kept good, because a phase noise characteristic of the local oscillation frequency is improved keeping AFC accuracy.

(Third exemplary embodiment)

Figure 3:
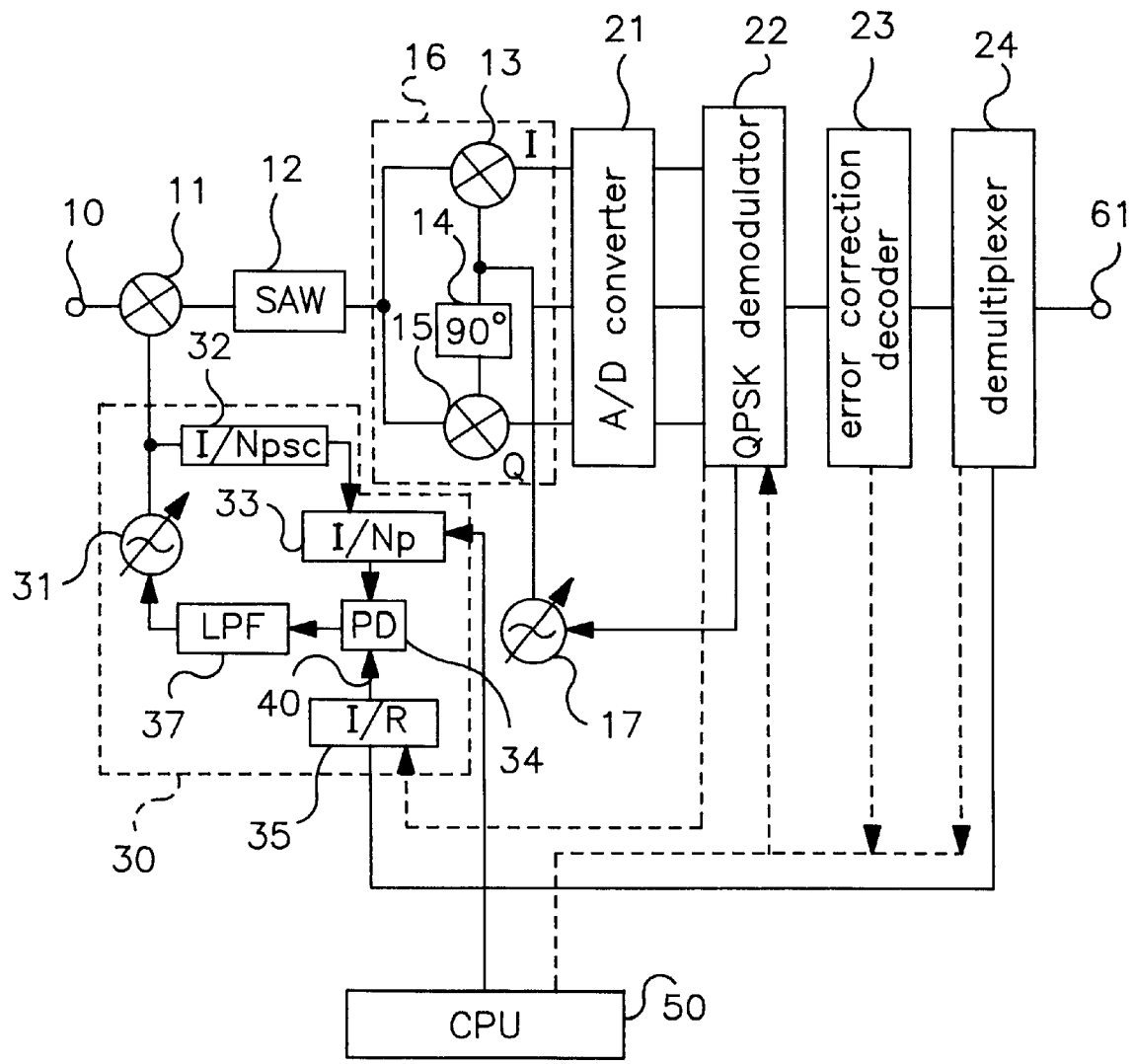
FIG. 3 is a block diagram of a digital satellite broadcast receiver in accordance with a third exemplary embodiment of the present invention.

In FIG. 3, the terminal 10 is an input terminal of a first IF signal from a receiving antenna for satellite broadcast. Mixer 11 may be used for frequency-converting a desired QPSK modulation signal into a designated second IF signal. Bandpass filter 12 may be used for extracting only the designated second IF signal from the output of mixer 11. Orthogonal detection means 16 may be used for inputting the output of bandpass filter 12 and for obtaining base band signals of an in-phase component I and a quadrature component Q by orthogonal detection. A/D converter 21 may be used for inputting the output of the I/Q orthogonal detection means 16 and for converting the I and Q base band signals into digital signals. QPSK demodulator 22 may be used for inputting the digitalized I and Q signals and for demodulating the inputted I and Q signals by QPSK. Error correction decoder may be used for correcting transmission errors. Demultiplexer 24 may be used for demultiplexing a transport stream in which band compressed video and sound signals are multiplexed. PLL synthesizer 30 may be used for generation a local oscillation signal necessary when the desired QPSK modulation signal is frequency-converted into a designated second IF signal at mixer 11. Orthogonal detection voltage-controlled oscillator 17 may be used for generating a local oscillation signal necessary for orthogonal detection.

The function of a digital broadcast receiver composed like the above is explained below.

The first IF signal received through a receiving antenna for satellite broadcast is mixed with a local oscillation signal generated at PLL synthesizer 30 at mixer 11 and a desired QPSK modulation signal of the first IF signal is frequency-converted into a designated second IF signal. PLL synthesizer 30 is composed of a local oscillator 31, a prescaler 32, a programmable frequency divider 33, a phase frequency detector 34, a reference frequency signal divider 35 and a loop filter 37.

The output of local oscillator 31 is frequency-divided at prescaler 32, is inputted to programmable frequency divider 33 and is further frequency-divided. The output of programmable frequency divider 33 is inputted to phase detector 34 and PLL synthesizer 30 is controlled so that the inputted signal to phase detector 34 coincides with a reference frequency signal 40 obtained by dividing the system clock signal generated at demultiplexer 24 at a reference frequency signal divider 35 in frequency and phase. The system clock signal may optionally be provided from QPSK demodulator 22. The local oscillation frequency fvco is expressed by (eq. 6).

$$fvco=(fr/R) \times Npsc \times Np \quad \text{(eq. 6)}$$

where fvco: oscillation frequency of the local oscillator, fr: frequency of the reference frequency signal, Npsc: frequency dividing ratio of the prescaler, Np: frequency dividing ratio of the programmable frequency divider and R: frequency dividing ratio of the reference frequency signal.

A local oscillation frequency corresponding to a frequency of a desired QPSK modulation signal can be obtained by varying frequency dividing ratio Np of programmable frequency divider 33 by microcomputer 50.

The QPSK modulation signal frequency-converted into a designated second IF signal at mixer 11 is inputted to orthogonal detector 16 after being extracted at bandpass filter 12. At orthogonal detector 16, an oscillation signal generated at orthogonal detection voltage-controlled oscillator 17 with a designated second IF and a signal phase-shifted by 90 degrees from the oscillation signal are supplied to mixers 13 and 15, respectively and they are mixed with the output signal of bandpass filter 12 there and base band signals of an in-phase component I and a quadrature component Q of the QPSK modulation signal, respectively.

The I and Q base band signals are converted to digital signals at an A/D converter 21 and are digitally demodulated at QPSK demodulator 22. QPSK demodulator 22 includes a carrier recovery and a clock recovery necessary for demodulation, an AGC detector and an AFC detector. The output of QPSK demodulator 22 does Viterbi decoding, deinterleaving, Reed-Solomon decoding or the like at error correction decoder 23 and corrects the error generated at a transmission route. The output signal from error correction decoder 23 is a transport stream multiplexed with video and sound signals encoded for band compression. Demultiplexer 24 demultiplexes and extracts video and sound signals encoded from the transport stream. The output of demultiplexer 24 is band expanded for each of video and sound signals and video and sound signals are reproduced. Error correction decoder 23 may optionally provide a synchronization signal which CPU 50 may use to control demodulator 22.

The oscillation frequency of local oscillator 31 generating a local frequency signal used for channel selection of a QPSK modulation signal is expressed by (eq. 7).

$$fvco=f1stIF=f2ndIF \quad \text{(eq. 7)}$$

where fvco: oscillation frequency of of the local oscillator for channel selection, f1stIF: frequency of the first IF, and f2ndIF: frequency of the second IF.

The oscillation frequency of local oscillator 31 is higher than the frequency of the first IF inputted from the receiving antenna for satellite broadcast by the frequency of the second IF and a frequency range of the first IF signal is necessary as an oscillation frequency range.

As an oscillator circuit to obtain such a wide frequency range, an oscillator having a resonant circuit using a microstrip line and a variable capacitance diode as shown in FIG. 4 is necessary. In a digital modulation like QPSK, the phase noise of a local oscillation signal used for frequency conversion influences on a reception performance (bit error rate) of the receiver, different from a usual FM modulation. As a phase noise not to influence on bit error rate, 85 dBc/Hz and 95 dBc/Hz are necessary at frequencies off-set by 10 kHz and 100 kHz from the oscillation frequency, respectively.

The phase noise of a local oscillation signal having a wide oscillation frequency range, however, becomes large because the quality factor Q of the resonant circuit decreases due to an internal resistance of the variable capacitance diode and the phase noise power decreases according to increase of frequency deviation from the oscillation frequency as shown in FIG. 5. That is a 1/f characteristic. The noise characteristic near the oscillation frequency such as at 10 kHz and 100 kHz previously described can be improved by using a PLL synthesizer and can be realized by making a reference frequency of the phase detection at PLL synthesizer 30 high and making an open loop gain high. The reference frequency is determined by a frequency of a QPSK system clock generated at demultiplexer 24 and a frequency dividing ratio at reference frequency signal divider 35 and it is selected as high as the phase noise near the oscillation frequency of local oscillator 31 can be reduced and its value is several hundreds kHz. The system clock frequency generated at demultiplexer 24 is 27 MHz and to exceed the reference frequency of several hundreds kHz, a frequency dividing ratio of 32 to 128 is necessary as a frequency dividing ratio of reference frequency signal divider 35. The reference frequency (fr/R) is a step frequency of PLL synthesizer 30 and the output frequency of local oscillator 31 is integer times of the reference frequency and does not always coincide with local oscillation frequency to convert the first IF signal into a designated second IF signal. That is, a deviation occurs in the frequency of the second IF signal.

Therefore, by making orthogonal detection voltage-controlled oscillator 17 so that the oscillation frequency continuously varies by an AFC signal outputted from QPSK demodulator 22 as shown in FIG. 6, frequency drift of a frequency converter (not shown) in a receiving antenna for satellite broadcast and frequency drift from the original second IF frequency due to frequency drift by increasing the reference frequency of PLL synthesizer 30 can be compensated with high accuracy at orthogonal detector 16.

Thus, according to the third exemplary embodiment of the present invention, because a phase noise characteristic of the local oscillation frequency is improved keeping AFC accuracy, the characteristic of bit error rate as a receiver can be kept good and because a system clock signal at demultiplexer means of encoded and multiplexed video and sound signals is frequency-divided and the divided signal is used as a reference frequency signal of phase frequency detection at PLL synthesizer 30 and a clock signal of the transmitter side in good accuracy is used as a reference frequency signal, the frequency accuracy of the reference frequency signal against temperature variation is kept good and a reference frequency signal generator in PLL synthesizer 30 can be eliminated.

Also by controlling orthogonal detection voltage-controlled oscillator 17 by PLL synthesizer, making the step frequency smaller enough than the step frequency of PLL synthesizer 30 used for channel selection and varying the oscillation frequency according to the AFC signal outputted from the QPSK demodulator 22, frequency drift of the second IF signal can be compensated with high accuracy at orthogonal detector 16 and the characteristic of bit error rate as a receiver can be kept good, because a phase noise characteristic of the local oscillation frequency is improved keeping AFC accuracy.

(Fourth exemplary embodiment)

Figure 7:
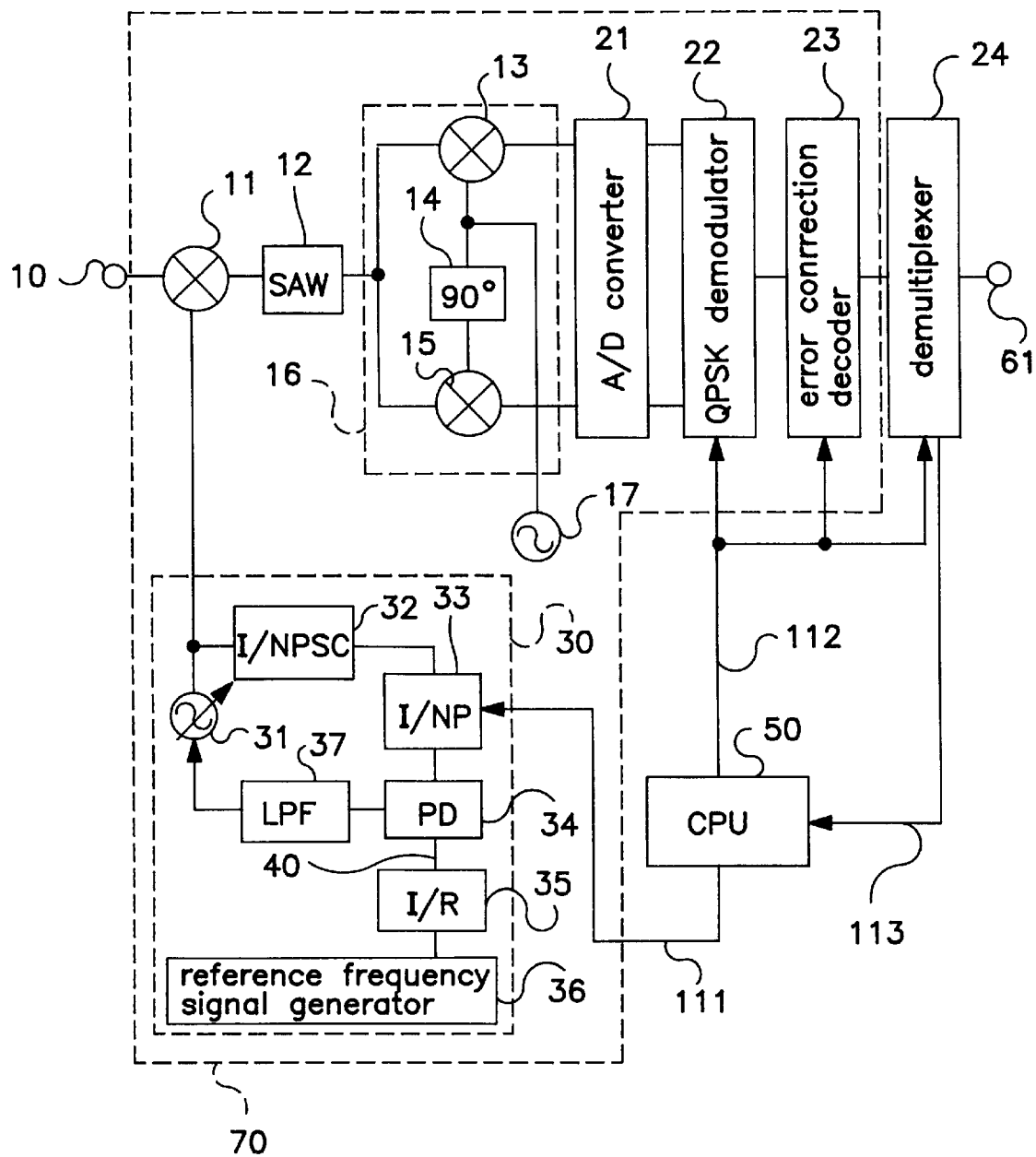
FIG. 7 is a block diagram of a digital satellite broadcast receiver in accordance with a fourth exemplary embodiment of the present invention.

In FIG. 7, the terminal 10 is an input terminal of a first IF signal from a receiving antenna for satellite broadcast. Mixer 11 may be used for frequency-converting a desired QPSK modulation signal into a designated second IF signal. Bandpass filter 12 may be used for extracting only the designated second IF signal from the output of mixer 11. Orthogonal detection means 16 may be used for inputting the output of bandpass filter 12 and for obtaining base band signals of an in-phase component I and a quadrature component Q by orthogonal detection. A/D converter 21 may be used for inputting the output of the I/Q orthogonal detection means 16 and for converting the base band signals of I and Q components into digital signals. QPSK demodulator 22 may be used for inputting the digitalized I and Q signals and for demodulating the inputted I and Q signals by QPSK. Error correction decoder 23 may be used for correcting transmission errors. Transport demultiplexer 24 may be used for separating a transport stream signal which band compressed video and sound signals are multiplexed. PLL synthesizer 30 may be used for generation a local oscillation signal necessary when the desired QPSK modulation signal is frequency-converted into a designated second IF signal at mixer 11. Orthogonal detection oscillator 17 may be used for generating a local oscillation signal necessary for orthogonal detection. Microcomputer may be used for controlling PLL 30 as well as other system components, such as, for example, QPSK demodulator 22. Bus 111 may be used as a control bus from microcomputer 50 to PLL synthesizer 30. Bus 112 may be used as a control bus from microcomputer 50 to QPSK demodulator 22 and the like.

The function of a digital broadcast receiver composed like the above is explained below.

The first IF signal received through a receiving antenna for satellite broadcast is mixed with a local oscillation signal generated at PLL synthesizer 30 at mixer 11 and a desired QPSK modulation signal of the first IF signal is frequency-converted into a designated second IF signal. PLL synthesizer 30 is composed of a local oscillator 31, a prescaler 32, a programmable frequency divider 33, a phase frequency detector 34, a reference frequency signal divider 35, reference frequency signal generator 36 and a loop filter 37.

The output of local oscillator 31 is inputted to programmable frequency divider 33 and frequency -divided after being frequency-divided at prescaler 32. The output of programmable frequency divider 33 is inputted to phase frequency detector 34 an PLL synthesizer 30 is controlled so that the inputted signal to phase detector 34 coincides in frequency and phase with a reference frequency signal 40 obtained by dividing the output of a reference frequency signal generator 36 at a reference frequency signal divider 35. The local oscillation frequency Fvco is expressed by (eq. 2) as previously shown and a local oscillation frequency corresponding to a frequency of desired QPSK modulation signal can be obtained by varying a frequency dividing ratio Np of programmable frequency divider 33 by microcomputer 50. The QPSK modulation signal frequency-converted into a designated second IF at mixer 11 is inputted to orthogonal detector 16 after being extracted at bandpass filter 12.

At orthogonal detector 16, an oscillation signal generated at orthogonal detection oscillator 17 with a designated second IF and a signal phase-shifted by 90 degrees from the oscillation signal are supplied to mixers 13 and 15, respectively and they are mixed with the output signal of bandpass filter 12 there and base band signals of an in-phase component I and a quadrature component Q of the QPSK modulation signal, respectively.

The base band signals of I and Q components are converted to digital signals at an A/D converter 21 and are digitally demodulated at QPSK demodulator 22. QPSK demodulator 22 includes a carrier recovery and a clock recovery necessary for demodulation, an AGC detector and an AFC detector. The output of QPSK demodulator 22 does Viterbi decoding, deinterleaving, Reed-Solomon decoding or the like at error correction decoder 23 and corrects the error generated at a transmission route. The output signal from error correction decoder 23 is a transport stream signal multiplexed with video and sound signals encoded for band compression. Transport demultiplexer 24 separates and extracts video and sound signals encoded from the transport stream signal. The output of transport demultiplexer 24 is band expanded for each of video and sound signals and video and sound signals are reproduced.

To prevent deterioration of bit error rate due to a control signal from the microcomputer during reception, the control bus of microcomputer 50 is separated into a bus 111 to PLL synthesizer 30 and another bus 112 to QPSK demodulator 22, error correction decoder 23, etc. Because synchronization at transport demultiplexer 24 becomes impossible when PLL synthesizer 30 malfunctions by a surge and the like due to a thunder during reception and a channel selection becomes impossible, microcomputer 50 checks a synchronization establishment signal 113 from transport demultiplexer 24, renews the control data to PLL synthesizer 30 when transport demultiplexer 24 can not synchronize and makes a channel selection again.

It is obvious that a similar effect is obtained also when the circuit is composed so that microcomputer 50 checks synchronization establishment signal 13 from transport demultiplexer 24 through control bus 112.

Thus, it is possible to prevent deterioration of receiving quality due to deterioration of noise characteristic of a local oscillation signal during a reception.

Note that, in general, a demodulator, such as, for example, demodulator 70 of FIG. 7, may include: PLL 30, mixer 11, filter 12, oscillator 17, detector 16, A/D converter 21, QPSK demodulator 22, and error correction means 23.

(Fifth exemplary embodiment)

A fifth exemplary embodiment of the present invention is explained below, referring to FIG. 8.

Figure 8:
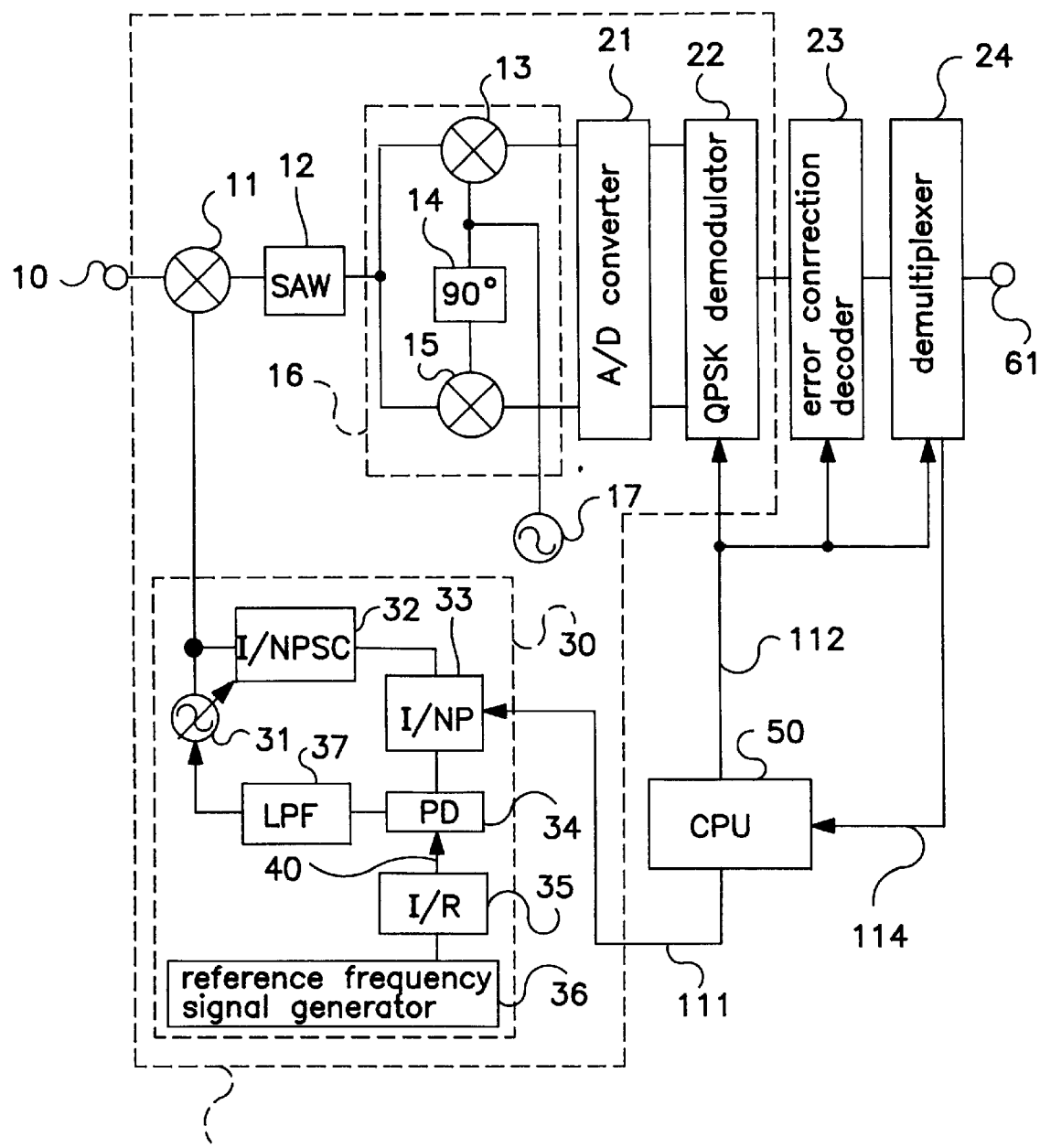
FIG. 8 is a block diagram of a digital satellite broadcast receiver in accordance with a fifth exemplary embodiment of the present invention.

In FIG. 8, the terminal 10 is an input terminal of a first IF signal from a receiving antenna for satellite broadcast. Mixer 11 may be used for frequency-converting a desired QPSK modulation signal into a designated second IF signal. Bandpass filter 12 may be used for extracting only the designated second IF signal from the output of mixer 11. Orthogonal detection means 16 may be used for inputting the output of bandpass filter 12 and for obtaining base band signals of an in-phase component I and a quadrature component Q by orthogonal detection. A/D converter 21 may be used for inputting the output of the orthogonal detection means 16 and for converting the I and Q base band signals into digital signals. QPSK demodulator 22 may be used for inputting the digitalized I and Q signals and for demodulating the inputted I and Q signals by QPSK. Error correction decoder may be used for correcting transmission errors. Transport demultiplexer 24 may be used for demultiplexing a transport stream in which band-compressed video and sound signals are multiplexed. PLL synthesizer 30 may be used for generation a local oscillation signal necessary when the desired QPSK modulation signal is frequency-converted into a designated second IF signal at mixer 11. Orthogonal detection voltage-controlled oscillator 17 may be used for generating a local oscillation signal necessary for orthogonal detection. Microcomputer 50 may be used to control PLL 30 as well as other system components such as, for example, QPSK demodulator 22. Bus 111 may be used as a control bus from microcomputer 50 to PLL synthesizer 30. Bus 112 may be used as a control bus from microcomputer 50 to QPSK demodulator 22 and the like.

The function of a digital broadcast receiver composed like the above is explained below.

The first IF signal received through a receiving antenna for satellite broadcast is mixed with a local oscillation signal generated at PLL synthesizer 30 at mixer 11 and a desired QPSK modulation signal of the first IF signal is frequency-converted into a designated second IF signal. PLL synthesizer 30 is composed of a local oscillator 31, a prescaler 32, a programmable frequency divider 33, a phase frequency detector 34, a reference frequency signal divider 35, reference frequency signal generator 36 and a loop filter 37. The output of local oscillator 31 is inputted to programmable frequency divider 33 and frequency-divided after being frequency-divided at prescaler 32. The output of programmable frequency divider 33 is inputted to phase detector 34 and PLL synthesizer 30 is controlled so that the input signal to phase detector 34 coincides in frequency and phase with a reference frequency signal 40 obtained by dividing the output of a reference frequency signal generator 36 at a reference frequency signal divider 35.

The local oscillation frequency Fvco is expressed by (eq. 4) as previously shown and a local oscillation frequency corresponding to a frequency of desired QPSK modulation signal can be obtained by varying a frequency dividing ratio Np of programmable frequency divider 33 by microcomputer 50. The QPSK modulation signal frequency-converted into a designated second IF at mixer 11 is inputted to orthogonal detector 16 after being extracted at bandpass filter 12.

At orthogonal detector 16, an oscillation signal generated at orthogonal detection oscillator 17 with a designated second IF and a signal phase-shifted by 90 degrees from the oscillation signal are supplied to mixers 13 and 15, respectively and they are mixed with the output signal of bandpass filter 12 there and low band signals equivalent to an in-phase component I and a quadrature component Q of the QPSK modulation signal, respectively.

The low band signals equivalent to I and Q signals are converted to digital signals at an A/D converter 21 and are digitally demodulated at QPSK demodulator 22. QPSK demodulator 22 includes a carrier recovery and a clock recovery necessary for demodulation, an AGC detector and an AFC detector. The output of QPSK demodulator 22 does Viterbi decoding, deinterleaving, Reed-Solomon decoding or the like at error correction decoder 23 and corrects the error generated at a transmission route. The output signal from error correction decoder 23 is a transport stream signal multiplexed with video and sound signals encoded for band compression. Transport demultiplexer 24 demultiplexes and extracts video and sound signals encoded from the transport stream signal. The output of transport demultiplexer 24 is band expanded for each of video and sound signals and video and sound signals are reproduced.

To prevent deterioration of bit error rate due to a control signal from the microcomputer during reception, the control bus of microcomputer 50 is separated into a bus 111 to PLL synthesizer 30 and another bus 112 to QPSK demodulator 22, error correction decoder 23, etc. Because frame synchronization at error correction decoder 23 becomes impossible when PLL synthesizer 30 malfunctions by a surge and the like due to a thunder during reception and a channel selection becomes impossible, microcomputer 50 checks a frame synchronization signal 114 from error correction decoder 23, renews the control data to PLL synthesizer 30 when error correction decoder 23 can not synchronize and makes a channel selection again.

It is obvious that a similar effect is obtained also when the circuit is composed so that microcomputer 50 checks the frame sync signal from error correction decoder 23 through control bus 112 of microcomputer 50.

Thus, it is possible to prevent deterioration of receiving quality due to deterioration of noise characteristic of a local oscillation signal during a reception.

Note that, in general, a demodulator, such as, for example, demodulator 72 of FIG. 8, may include: PLL 30, mixer 11, filter 12, oscillator 17, detector 16, A/D converter 21, and QPSK demodulator 22.

(Sixth exemplary embodiment)

A sixth exemplary embodiment of the present invention is explained below, referring to FIG. 9.

Figure 9:
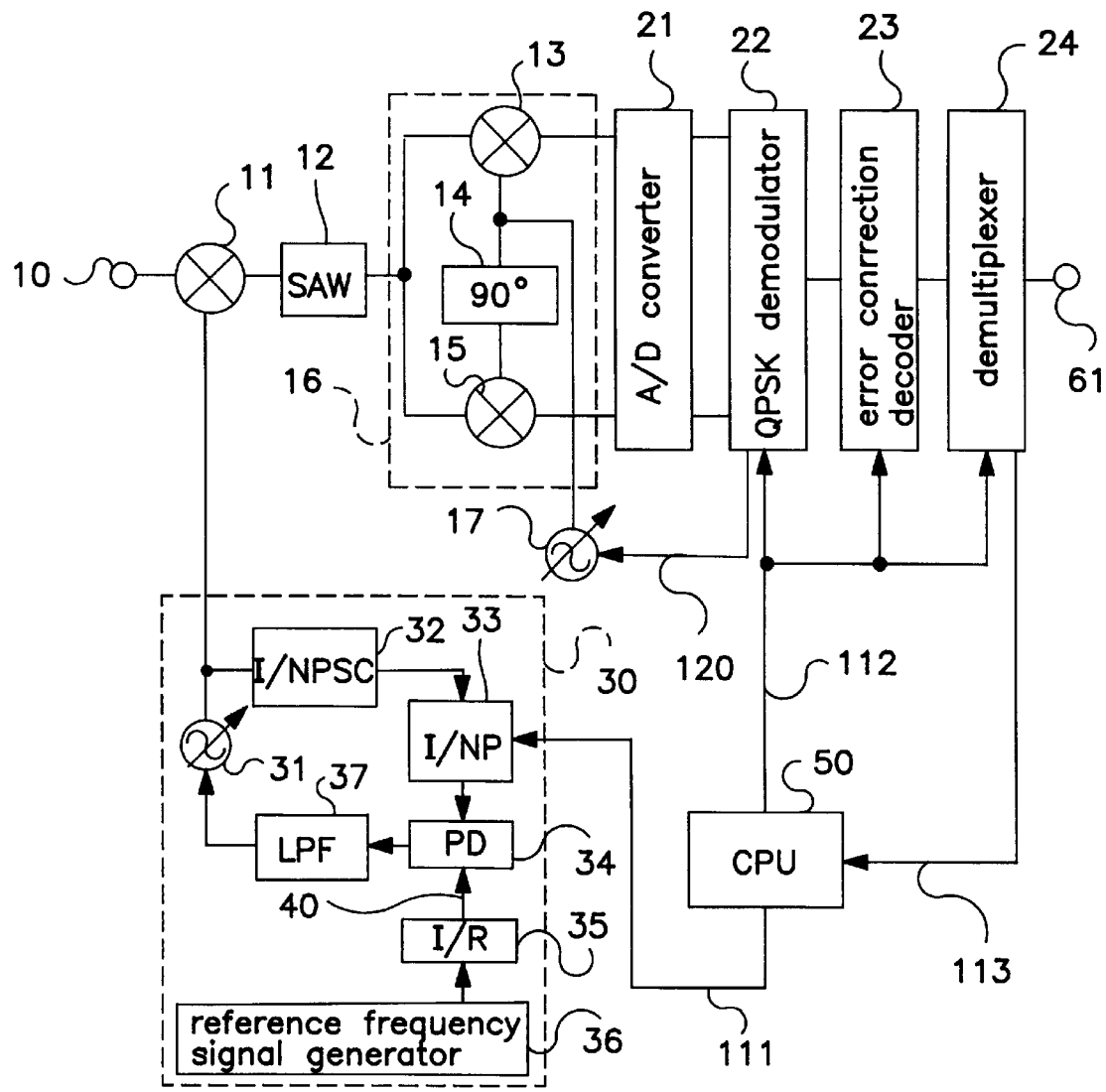
FIG. 9 is a block diagram of a digital satellite broadcast receiver in accordance with a sixth exemplary embodiment of the present invention.

FIG. 9 shows that an AFC function is added to prevent deterioration of bit error rate by a control bus from the microcomputer during reception in the fourth exemplary embodiment shown in FIG. 7. Components having the same reference numbers have similar functions to those in the fourth exemplary embodiment and their explanations are omitted.

A frequency drift occurs in the first IF signal inputted from a first IF signal input terminal 10 due to a frequency converter of a receiving antenna (not shown) for satellite broadcast. The frequency drift of the first IF signal is generally +/−2.5 MHz and to compensate it, AFC is needed in a receiver.

Because if the AFC is done by varying a frequency dividing ratio of PLL synthesizer 30 through microcomputer 50 as shown in the prior art, the control data is sent to PLL synthesizer 30 during reception and it brings deterioration of bit error rate due to phase noise deterioration of local frequency oscillator 31, the AFC is made as follows in the sixth exemplary embodiment.

Figure 13:
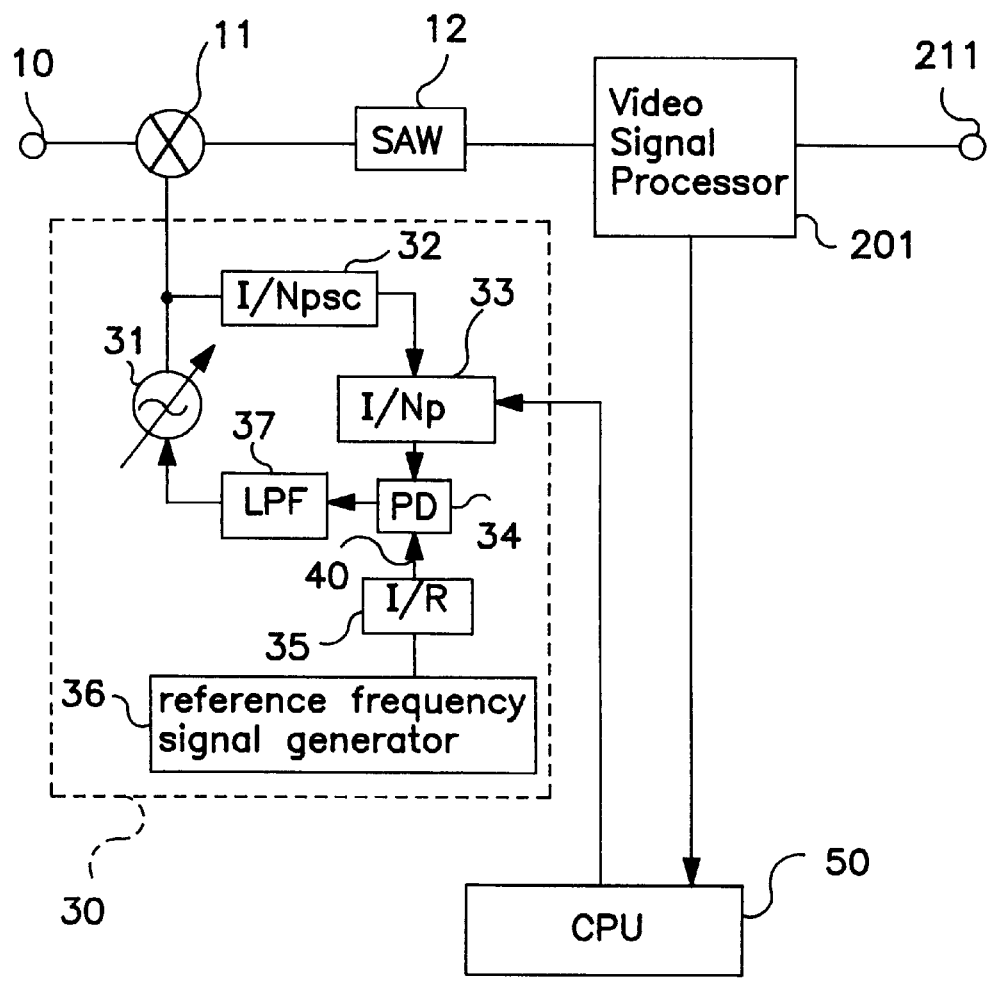
FIG. 13 is a block diagram of a satellite broadcast receiver in accordance with the prior art.
Figure 14:
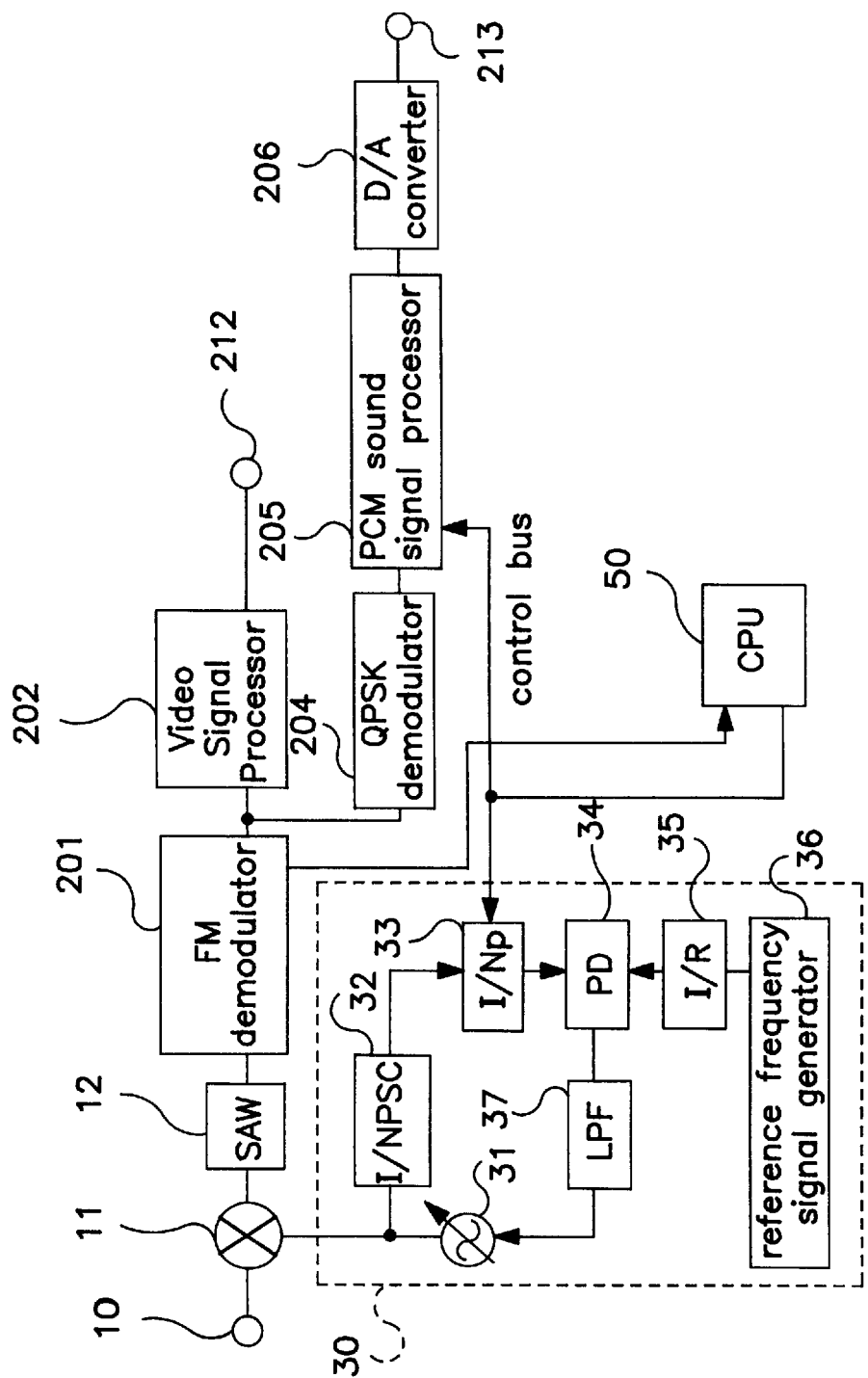
FIG. 14 is a block diagram of a digital satellite broadcast receiver in accordance with the prior art.
Figure 15:
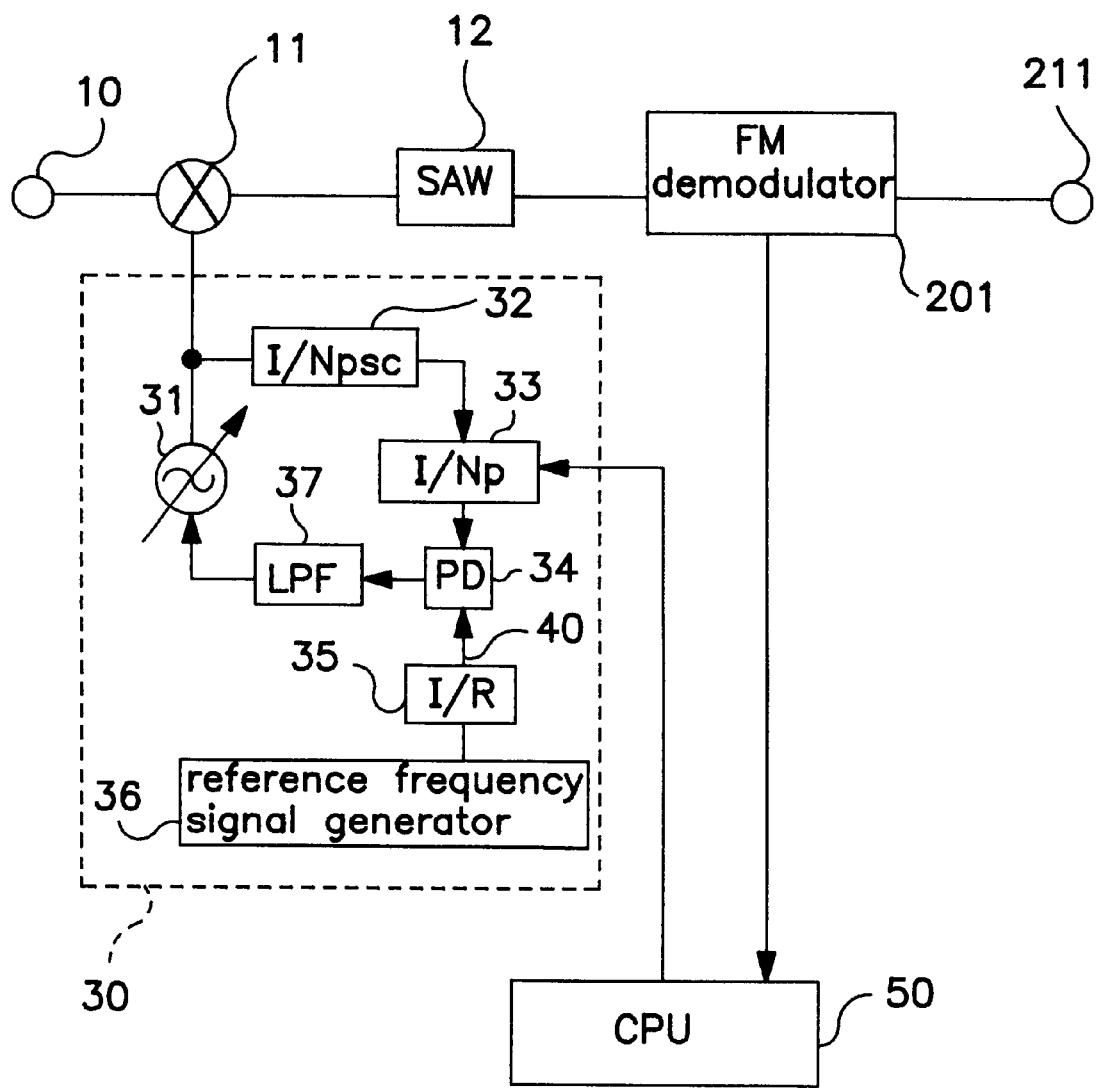
Figure 16:
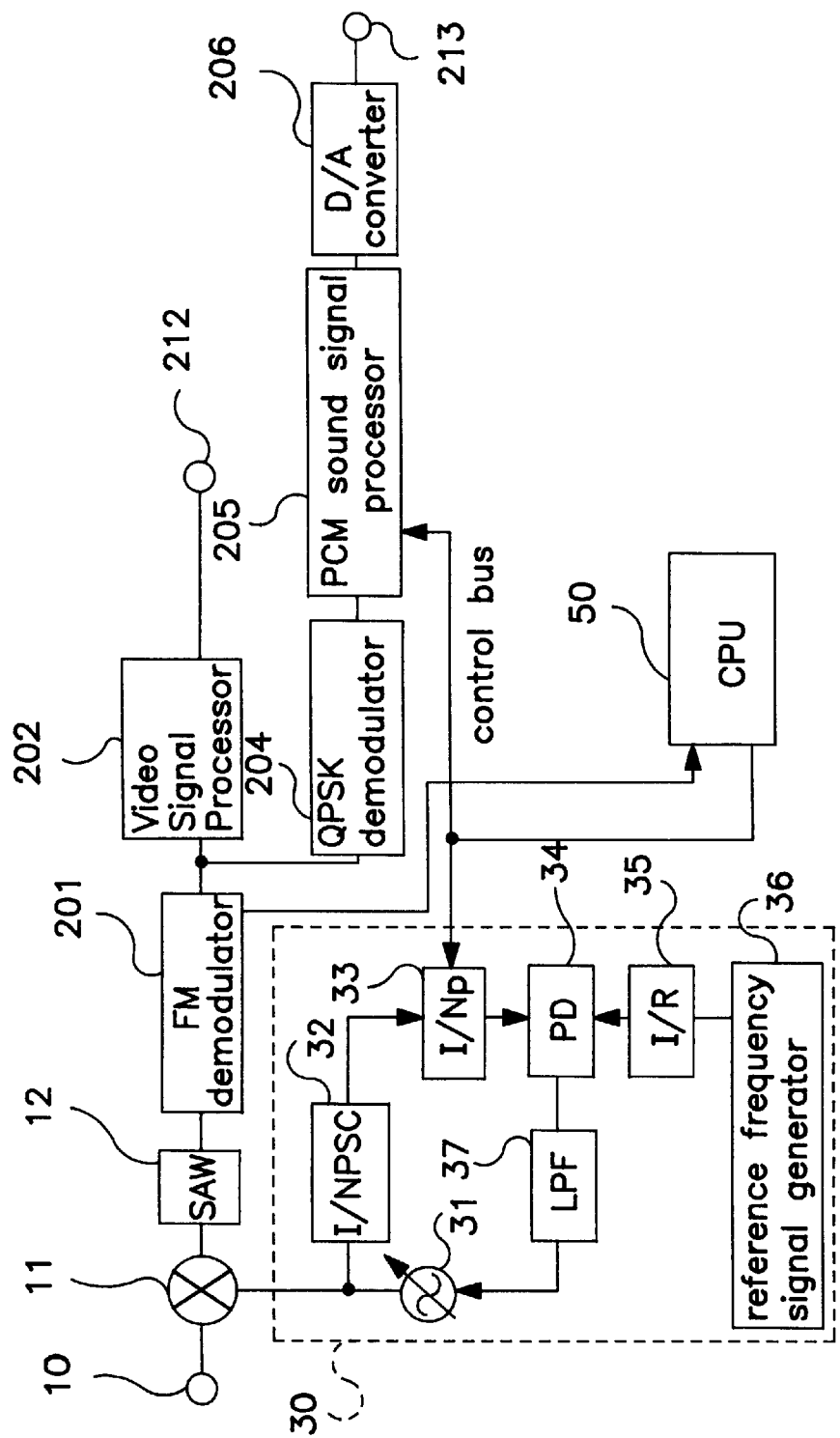

In QPSK demodulator 22, the frequency drift is detected from inputted I and Q base band signals and a frequency drift detection signal 120 is outputted as an analog voltage against the frequency drift. A voltage-controlled oscillator shown in FIG. 13 is used as an orthogonal detection oscillator 17, which is used for an orthogonal detector 16. The oscillation frequency is varied by varying the capacitance of a variable capacitance diode 302 shown in FIG. 13 through frequency drift detection signal 120 and the frequency drift of QPSK demodulator 22 is compensated.

Thus, because microcomputer 50 does not need to renew a frequency dividing ratio control signal to PLL synthesizer 30 against the frequency drift of QPSK modulated signal by doing AFC at orthogonal detector 16, it is possible to prevent deterioration of reception quality due to sending control data to PLL synthesizer 30 at AFC during reception.

In the case in which the frequency drift of the first IF signal is smaller enough than the necessary bandwidth of the QPSK modulation signal (for example, the frequency drift is +/−2.5 MHz against the necessary bandwidth of 27 MHz of the QPSK modulation signal), there is no problem with only a control by orthogonal detection oscillator 17 as shown in the sixth exemplary embodiment but when the frequency drift of the first IF signal is going larger against the necessary bandwidth of the QPSK modulation signal, unless the AFC is made by PLL synthesizer 30, the bandwidth of the desired QPSK modulation signal is narrowed at a bandpass filter (SAW filter, surface acoustic wave filter) 12 for extracting a QPSK modulation signal and the reception becomes impossible. In such a case, an AFC by PLL synthesizer 30 is necessary. An AFC of the present invention is described below, which does not cause deterioration of bit error rate due to phase noise deterioration of local frequency oscillator 31 during reception even if AFC is done by varying the frequency dividing ratio of PLL synthesizer 30 by microcomputer 50.

Because synchronization of transport demultiplexer 24 becomes impossible when the frequency drift is large at channel selection and PLL synthesizer 30 malfunctions by a surge due to a thunder during reception and as a result, channel selection becomes impossible, microcomputer 50 checks a synchronization establishment signal 113 coming from transport demultiplexer 24 and control data for PLL synthesizer 30 is renewed only at this case and AFC is done at PLL synthesizer 30.

Figure 12:
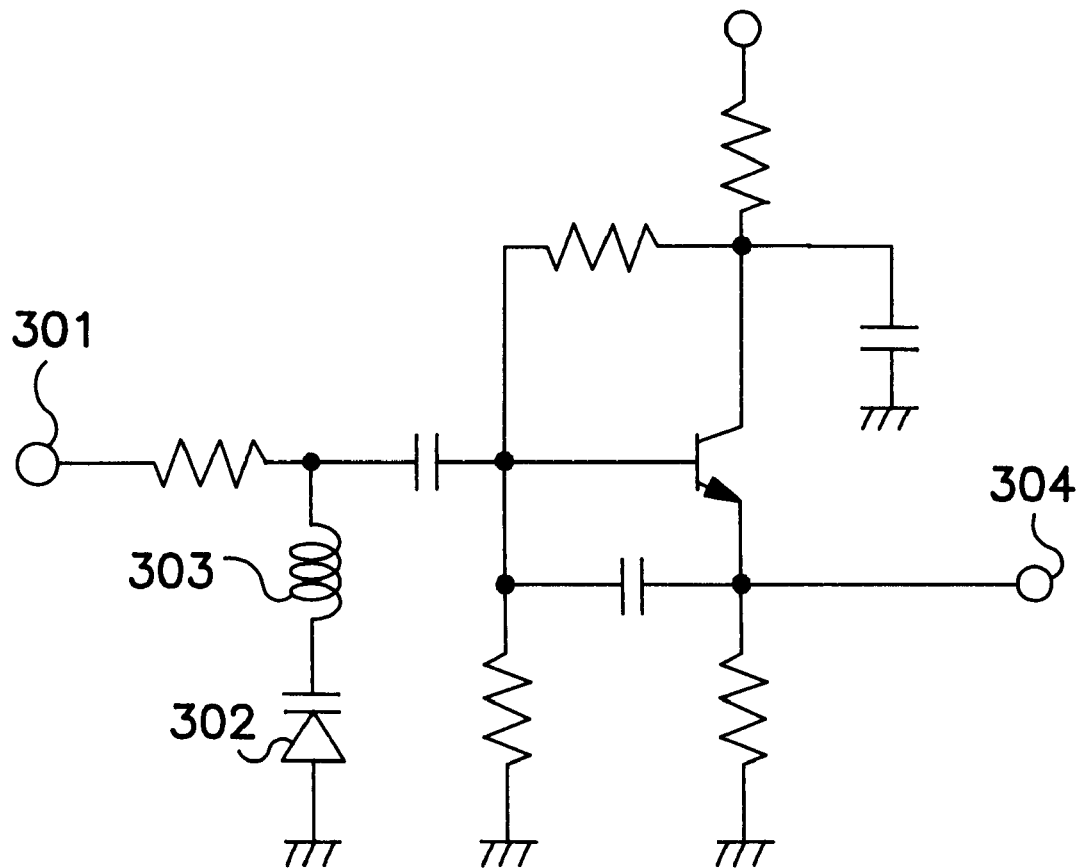
FIG. 12 is an exemplary circuit diagram of an orthogonal detection voltage controlled oscillator.

During reception, the frequency drift is detected from I and Q base band signals at QPSK demodulator 22 and a frequency drift detection signal 120 is outputted as an analogue voltage for a frequency drift. By using a voltage-controlled oscillator shown in FIG. 12 as an orthogonal detection oscillator 17 used in orthogonal detector 16 and varying the capacity of variable capacitance diode 302 shown in FIG. 12 by frequency drift detection signal 120, the oscillation frequency is varied and AFC is controlled.

Thus, because microcomputer 50 does not renew a control signal of the frequency dividing ratio for PLL synthesizer 30 during reception by doing AFC at PLL synthesizer 30 when transport demultiplexer 24 is not synchronized and by doing AFC at orthogonal detector 16 when transport demultiplexer 24 is synchronized, it becomes possible to prevent reception quality deterioration due to sending control data to PLL synthesizer 30 at AFC during reception.

A similar effect is obtained by doing AFC at PLL synthesizer 30 and orthogonal detector 16 when transport demultiplexer 24 is not synchronized and by doing AFC at only orthogonal detector 16 when transport demultiplexer 24 is synchronized.

It is obvious that a similar effect can be obtained also when the apparatus is composed so that microcomputer 50 checks a synchronization establishment signal of transport demultiplexer 24 through control bus 112.

(Seventh exemplary embodiment)

A seventh exemplary embodiment of the present invention is explained below, referring to FIG. 10.

Figure 10:
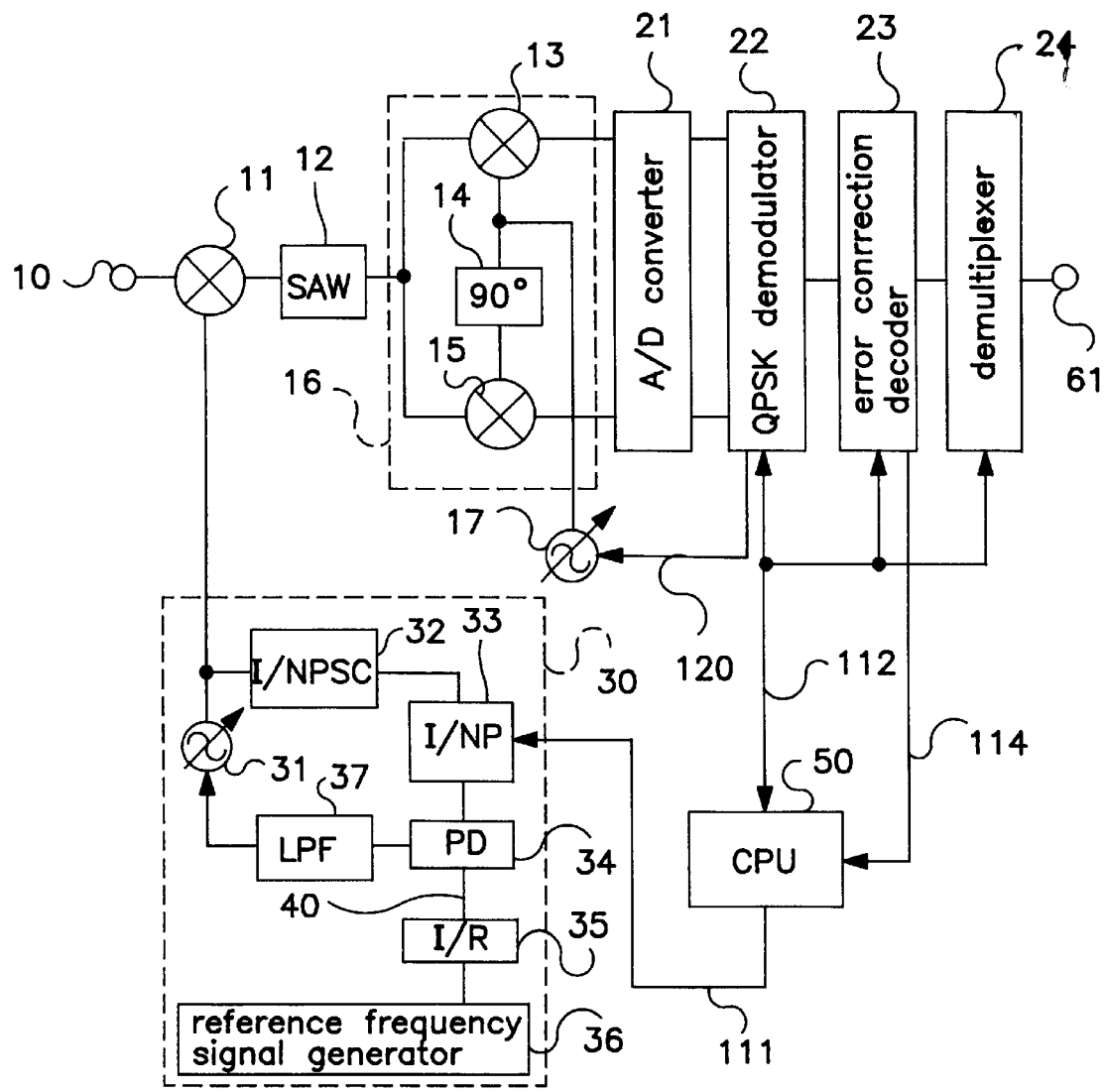
FIG. 10 is a block diagram of a digital satellite broadcast receiver in accordance with a seventh exemplary embodiment of the present invention.

FIG. 10 shows that an AFC function is added to prevent deterioration of bit error rate by a control bus from the microcomputer during reception in the fifth exemplary embodiment shown in FIG. 8. Components having the same reference numbers have similar functions to those in the fifth exemplary embodiment and their explanations are omitted.

A frequency drift occurs in the first IF signal inputted from a first IF signal input terminal 10 due to a frequency converter of a receiving antenna (not shown) for satellite broadcast. The frequency drift of the first IF signal is generally +/−2.5 MHz and to compensate it, AFC is needed in a receiver.

Because if the AFC is done by varying a frequency dividing ratio of PLL synthesizer 30 through microcomputer 50 as shown in the prior art, the control data is sent to PLL synthesizer 30 during reception and it brings deterioration of bit error rate due to phase noise deterioration of local frequency oscillator 31, the AFC is made as follows in the seventh exemplary embodiment.

In QPSK demodulator 22, the frequency drift is detected from inputted I and Q base band signals and a frequency drift detection signal 120 is outputted as an analog voltage against the frequency drift. A voltage-controlled oscillator shown in FIG. 13 is used as an orthogonal detection oscillator 17, which is used for an orthogonal detector 16. The oscillation frequency is varied by varying the capacitance of a variable capacitance diode 302 shown in FIG. 13 through frequency drift detection signal 120 and the frequency drift of QPSK demodulator 22 is, compensated.

Thus, because microcomputer 50 does not need to renew a frequency dividing ratio control signal to PLL synthesizer 30 against the frequency drift of QPSK modulated signal by doing AFC at orthogonal detector 16, it is possible to prevent deterioration of reception quality due to sending control data to PLL synthesizer 30 at AFC during reception.

(Eighth exemplary embodiment)

A eighth exemplary embodiment of the present invention is explained below, referring to FIG. 11.

Figure 11:
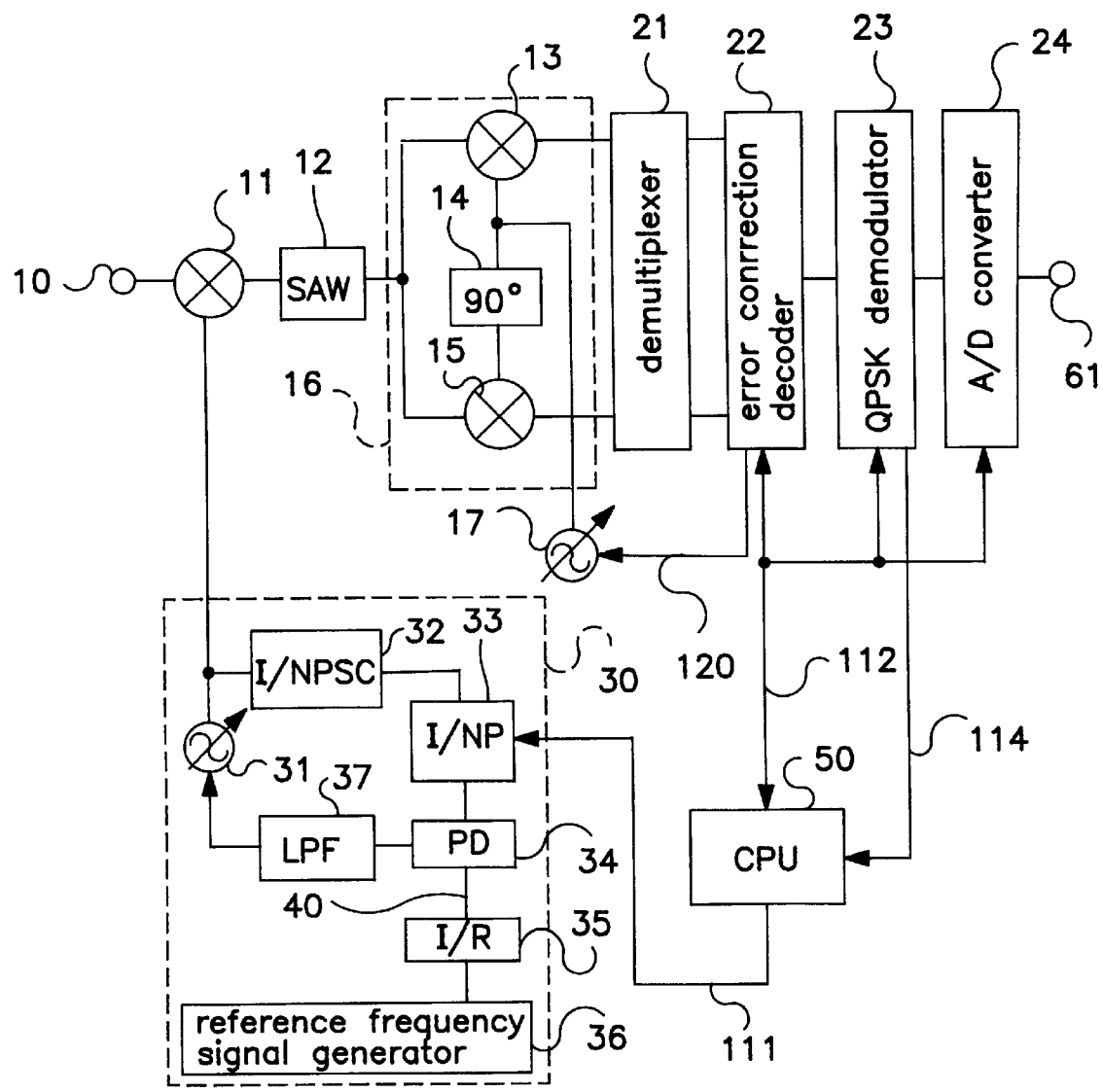
FIG. 11 is a block diagram of a digital satellite broadcast receiver in accordance with a eighth exemplary embodiment of the present invention.

FIG. 11 shows that an AFC function is added to prevent deterioration of bit error rate by a control bus from the microcomputer during reception in the fifth exemplary embodiment shown in FIG. 8. Components having the same reference numbers have similar functions to those in the fifth exemplary embodiment and their explanations are omitted.

A frequency drift occurs in the first IF signal inputted from a first IF signal input terminal 10 due to a frequency converter of a receiving antenna (not shown) for satellite broadcast. The frequency drift of the first IF signal is generally +/−2.5 MHz and to compensate it, AFC is needed in a receiver.

In the case in which the frequency drift of the first IF signal is smaller enough than the necessary bandwidth of the QPSK modulation signal (for example, the frequency drift is +/−2.5 MHz against the necessary bandwidth of 27 MHz of the QPSK modulation signal), there is no problem with only a control by orthogonal detection oscillator 17 as shown in the seventh exemplary embodiment but when the frequency drift of the first IF signal is going larger against the necessary bandwidth of the QPSK modulation signal, unless the AFC is made by PLL synthesizer 30, the bandwidth of the desired QPSK modulation signal is narrowed at a bandpass filter 12 for extracting a QPSK modulation signal and the reception becomes impossible.

In such a case, an AFC by PLL synthesizer 30 is necessary. An AFC of the present invention is described below, which does not cause any picture quality deterioration due to phase noise deterioration of local frequency oscillator 31 during reception even if an AFC is done by varying the frequency dividing ratio of PLL synthesizer 30 by microcomputer 50.

Because frame synchronization of error correction decoder 23 becomes impossible when PLL synthesizer 30 malfunctions by a surge due to a thunder during reception and as a result, channel selection becomes impossible, microcomputer 50 checks a frame sync signal 114 coming from error correction decoder 23 at channel selection and control data for PLL synthesizer 30 is renewed only at this case and AFC is done at PLL synthesizer 30.

During reception, the frequency drift is detected from I and Q base band signals at QPSK demodulator 22 and a frequency drift detection signal 120 is outputted as an analog voltage for a frequency drift. By using a voltage-controlled oscillator shown in FIG. 12 as an orthogonal detection oscillator 17 used in orthogonal detector 16 and varying the capacity of variable capacitance diode 302 shown in FIG. 12 by frequency drift detection signal 120, the oscillation frequency is varied and AFC is controlled.

Thus, because microcomputer 50 does not renew a control signal of the frequency dividing ratio for PLL synthesizer 30 during reception by doing AFC at PLL synthesizer 30 when error correction decoder 23 is not synchronized and by doing AFC at orthogonal detector 16 when error correction decoder 23 is synchronized, it becomes possible to prevent reception quality deterioration due to sending control data to PLL synthesizer 30 at AFC during reception.

A similar effect is obtained by doing AFC at PLL synthesizer 30 and orthogonal detector 16 when error correction decoder 23 is not synchronized and by doing AFC at only orthogonal detector 16 when error correction decoder 23 is synchronized.

It is obvious that a similar effect can be obtained also when the apparatus is composed so that microcomputer 50 checks a frame synchronization establishment signal of error correction decoder 23 through control bus 112.

According to a digital broadcast receiver in accordance with the first to third exemplary embodiments of the present invention, because the phase noise characteristic of a local oscillation signal is improved, keeping an AFC accuracy, the bit error rate characteristic as a receiver can be kept good.

According to a digital broadcast receiver in accordance with the fourth to ninth exemplary embodiments of the present invention, it is possible to prevent deterioration of a bit error rate and a reception quality by that the noise characteristic of a local oscillation signal deteriorates due to control data coming from a microcomputer during reception.

The invention may be embodied in other specific form without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed:

1. A digital receiver comprising:
    a PLL for generating a local oscillation signal based on phase detection and comparison with a reference frequency signal;
    a mixer for converting a QPSK (quaternary phase-shift keying) modulated signal into a first intermediate frequency signal based on the local oscillation signal;
    a bandpass filter for extracting a second intermediate frequency signal from the first intermediate frequency signal;
    orthogonal detector for detecting an in-phase component I and a quadrature component Q of the second intermediate frequency signal and for continuously compensating a frequency drift of the second intermediate frequency signal;
    an A/D converter for converting the in-phase component signal I and the quadrature component signal Q of the second intermediate frequency signal to a digital in-phase component signal and a digital quadrature component signal;
    QPSK demodulator for digitally demodulating the digital in-phase component signal and the digital quadrature component signal and for producing an encoded and multiplexed signal;
    error correction means for correcting transmission errors of the encoded and multiplexed signal; and
    a demultiplexer for demultiplexing the output of said error correction means and for producing a system clock signal,
    wherein the reference frequency signal for phase detection and comparison by said PLL is calculated by dividing the system clock signal produced by said demultiplexer.

2. A digital receiver comprising:

a PLL for generating a local oscillation signal based on phase detection and comparison with a reference frequency signal;

a mixer for converting a QPSK (quaternary phase-shift keying) modulated signal into a first intermediate frequency signal based on the local oscillation signal;

a bandpass filter for extracting a second intermediate frequency signal from the first intermediate frequency signal;

orthogonal detector for detecting an in-phase component I and a quadrature component Q of the second intermediate frequency signal and for continuously compensating a frequency drift of the second intermediate frequency signal;

an A/D converter for converting the in-phase component signal I and the quadrature component signal Q of the second intermediate frequency signal to a digital in-phase component signal and a digital quadrature component signal;

QPSK demodulator for digitally demodulating the digital in-phase component signal and the digital quadrature component signal and for producing an encoded and multiplexed signal;

error correction means for correcting transmission errors of the encoded and multiplexed signal;

a demultiplexer for demultiplexing the output of said error correction means and for generating a synchronization signal;

a microcomputer for controlling the PLL based on the synchronization signal; and a control bus for relaying a control signal from the microcomputer to the PLL, wherein the microcomputer resets the PLL by relaying the control signal via the control bus when the demultiplexer indicates a loss of synchronization via the synchronization signal.

3. A digital receiver as recited in claim 2, wherein the QPSK demodulator recovers a clock signal and the reference frequency signal for phase detection and comparison by said PLL is calculated by dividing the frequency of the clock signal.

4. A digital receiver as recited in claim 2, wherein wherein the demultiplexer produces a system clock signal and the reference frequency signal for phase detection and comparison by said PLL is calculated by dividing the frequency of the system clock signal.

5. A digital receiver comprising:

a PLL for generating a local oscillation signal based on phase detection and comparison with a reference frequency signal;

a mixer for converting a QPSK (quaternary phase-shift keying) modulated signal into a first intermediate frequency signal based on the local oscillation signal;

a bandpass filter for extracting a second intermediate frequency signal from the first intermediate frequency signal;

orthogonal detector for detecting an in-phase component I and a quadrature component Q of the second intermediate frequency signal and for continuously compensating a frequency drift of the second intermediate frequency signal;

an A/D converter for converting the in-phase component signal I and the quadrature component signal Q of the second intermediate frequency signal to a digital in-phase component signal and a digital quadrature component signal;

QPSK demodulator for digitally demodulating the digital in-phase component signal and the digital quadrature component signal and for producing an encoded and multiplexed signal;

error correction means for correcting transmission errors of the encoded and multiplexed signal, for outputting a corrected multiplexed signal, and for generating a synchronization signal;

a demultiplexer for demultiplexing the corrected multiplexed signal of said error correction means;

a microcomputer for controlling the PLL based on the synchronization signal; and a control bus for relaying a control signal from the microcomputer to the PLL, wherein the microcomputer resets the PLL by relaying the control signal via the control bus when the error correction means indicates a loss of synchronization via the synchronization signal.

6. A digital receiver as recited in claim 5, wherein the QPSK demodulator recovers a clock signal and the reference frequency signal for phase detection and comparison by said PLL is calculated by dividing the frequency of the clock signal.

7. A receiver, comprising:

a PLL (phase-locked loop) for selecting a QPSK modulated signal by generating a local oscillation signal based on phase detection and comparison with a reference frequency signal;

a demodulator for demodulating the selected QPSK modulated signal and producing a demodulated signal;

error correction means for correcting transmission errors in the demodulated signal and for generating a synchronization signal;

a microcomputer for controlling the demodulator based on the synchronization signal;

a control bus for relaying a control signal from the microcomputer to the demodulator, wherein the microcomputer resets the demodulator by relaying the control signal via the control bus when the error correction means indicates a loss of synchronization via the synchronization signal, an orthogonal detector for detecting a signal component of the selected QPSK modulated signal and for continuously performing AFC (automatic frequency control), the orthogonal detector processing the selected QPSK modulated signal prior to demodulation by the demodulator; and a demultiplexer for demultiplexing the output of said error correction means; wherein the demultiplexer produces a system clock signal and the reference frequency signal for phase detection and comparison by said PLL is calculated by dividing the frequency of the system clock signal.

8. A digital receiver as recited in claim 5, wherein the demultiplexer produces a system clock signal and the reference frequency signal for phase detection and comparison by said PLL is calculated by dividing the frequency of the system clock signal.

9. A receiver for receiving a QPSK modulated signal, the receiver comprising:

PLL synthesizer means for generating a local oscillation signal;

orthogonal detection means for orthogonally detecting said QPSK modulated signal which is selected using said local oscillation signal;

a demodulator for demodulating the detected QPSK modulated signal and producing an encoded and multiplexed signal.

a demultiplexer for demultiplexing the encoded and multiplexed signal and for generating a synchronization signal;

a microcomputer for controlling the demodulator based on the synchronization signal;

a control bus for relaying a control signal from the microcomputer to the demodulator, wherein the microcomputer resets the demodulator by relaying the control signal via the control bus when the demultiplexer indicates a loss of synchronization via the synchronization signal, wherein AFC (automatic frequency control) is performed at said PLL synthesizer means and said orthogonal detection means when synchronization of said demultiplexer means is not established; and continuous AFC is performed at said orthogonal detection means when synchronization of said demultiplexer means is established.

* * * * *

UNITED STATES PATENT AND TRADEMARK OFFICE
CERTIFICATE OF CORRECTION

PATENT NO. : 6,075,829
DATED : June 13, 2000
INVENTOR(S) : Hayashi et al.

It is certified that error appears in the above-identified patent and that said Letters Patent is hereby corrected as shown below:

Cover page, item [57], the Abstract should read:

--A digital broadcast receiver for receiving a digital modulation signal. The receiver includes: a first local oscillator, a mixer, a filter, a second local oscillator, an orthogonal detector, an A/D converter, an a demodulator. A radio frequency signal is mixed with a first local oscillation signal generated by the first local oscillator selecting a designated intermediate frequency signal. The intermediate frequency signal is then filtered by the bandpass filter. Phase detection and comparison with a reference frequency signal is used to control the first local oscillation signal. A second local oscillation signal generated by the second local oscillator is mixed by the orthogonal detector to detect an in-phase signal component and a quadrature component signal of the intermediate frequency signal. The orthogonal detector performs continuous automatic frequency control (AFC) for compensating for frequency drift. The signal components are then digitized by the A/D converter and demodulated by the demodulator. The digital receiver provides for high performance reception, improved automatic frequency control functionality, and lower bit error rates.--

Signed and Sealed this

Nineteenth Day of June, 2001

*Attest:*

*Attesting Officer*

NICHOLAS P. GODICI
*Acting Director of the United States Patent and Trademark Office*